United States Patent
Lim et al.

(10) Patent No.: US 11,373,694 B1
(45) Date of Patent: Jun. 28, 2022

(54) GENERIC PHYSICAL LAYER PROVIDING A UNIFIED ARCHITECTURE FOR INTERFACING WITH AN EXTERNAL MEMORY DEVICE AND METHODS OF INTERFACING WITH AN EXTERNAL MEMORY DEVICE

(71) Applicant: SKYECHIP SDN BHD, Bayan Lepas Pulau Pinang (MY)

(72) Inventors: Soon Chieh Lim, Bayan Lepas Pulau Pinang (MY); Chee Hak Teh, Bayan Lepas Pulau Pinang (MY); Tat Hin Tan, Bayan Lepas Pulau Pinang (MY)

(73) Assignee: SKYECHIP SDN BHD, Bayan Lepas (MY)

(*) Notice: Subject to any disclaimer, the term of this patent is extended or adjusted under 35 U.S.C. 154(b) by 0 days.

(21) Appl. No.: 17/169,430

(22) Filed: Feb. 6, 2021

(30) Foreign Application Priority Data

Dec. 29, 2020 (MY) .......................... PI2020007156

(51) Int. Cl.
*G11C 7/10* (2006.01)
*G11C 8/18* (2006.01)
*G11C 8/06* (2006.01)

(52) U.S. Cl.
CPC .............. *G11C 8/18* (2013.01); *G11C 7/1009* (2013.01); *G11C 7/1012* (2013.01); *G11C 7/1039* (2013.01); *G11C 8/06* (2013.01)

(58) Field of Classification Search
CPC .......... G11C 8/16; G11C 8/18; G11C 7/1009; G11C 7/1012; G11C 7/1039
USPC .................................................. 365/193, 194
See application file for complete search history.

(56) References Cited

U.S. PATENT DOCUMENTS

| | | | |
|---|---|---|---|
| 7,406,616 B2 * | 7/2008 | Hendrickson ........... | H03L 7/087 713/503 |
| 8,488,715 B2 * | 7/2013 | Saitoh ....................... | H04J 3/07 375/259 |
| 9,712,145 B2 | 7/2017 | Huang et al. | |
| 2011/0063931 A1 | 3/2011 | Linam et al. | |

* cited by examiner

*Primary Examiner* — Son L Mai
(74) *Attorney, Agent, or Firm* — Aslan Law, P.C.

(57) ABSTRACT

A generic physical layer providing a unified architecture for interfacing with an external memory device. The physical layer comprises a transmit data path for transmitting a parallel data to the external memory device and a receive data path for receiving a serial data from the external memory device. The generic physical layer is characterized by a receive enable logic for masking strobe of the serial data, wherein the transmit data path and the receive data path each comprising a FIFO circuit, a data rotator and an adjustable-delay logic for delay tuning and a per-bit-deskew for multi-lane support.

13 Claims, 30 Drawing Sheets

GENERIC PHYSICAL LAYER PROVIDING A UNIFIED ARCHITECTURE FOR INTERFACING WITH AN EXTERNAL MEMORY DEVICE AND METHODS OF INTERFACING WITH AN EXTERNAL MEMORY DEVICE

CROSS-REFERENCE TO RELATED APPLICATIONS

This application claims priority to Malaysian Patent Application No. PI2020007156 filed on Dec. 29, 2020, the entire contents of which are hereby incorporated by reference.

TECHNICAL FIELD

The present invention relates generally to computer memories. More particularly, the present invention relates to a generic physical layer providing a unified architecture for interfacing with an external memory device. Furthermore, the present invention relates to methods of interfacing with an external memory device.

BACKGROUND ART

As the processing speed of electronic systems has increased, there has been greater focus put on high-speed inter-chip signalling. High-speed inter-chip communication often requires precise clock signals for clocking data signals, and is often desirable that such clock signals provide such precision over a wide range of clock frequencies.

Numerous efforts have been made to provide delay lines or clock delays to achieve appropriate signal timing in a data transmission. Some of the efforts are discussed in the following references.

U.S. Pat. No. 9,712,145B2 discloses a delay line circuit including a plurality of delay circuits and a variable delay line circuit. The plurality of delay circuits receives an input signal and to generate a first output signal. The first output signal corresponds to a delayed input signal or an inverted input signal. The variable delay line circuit receives the first output signal. The variable delay line circuit includes an input end, an output end, a first and a second path. The input end is configured to receive the first output signal. The output end is configured to output a second output signal. The first path includes a first plurality of inverters and a first circuit. The second path includes a second plurality of inverters and a second circuit. The received first output signal is selectively transmitted through the first or second path based on a control signal received from a delay line controller.

US20110063931A1 discloses an input/output interface that reads data from and writes data to a DDR memory. The interface includes data and strobe circuits. The strobe circuit includes preamble logic, a first counter operating with a strobe clock, a second counter operating with an ASIC-generated clock, a strobe park circuit and a first synchronizer. The preamble logic receives strobe signals from the DDR memory and generates a preamble signal. The first counter generates a first input of the strobe park circuit. The second counter generates a second input of the strobe park circuit. The strobe park circuit controllably replaces the strobe signals from the DDR memory with respective non-transitioning signals when data is not being read. The data circuit includes a FIFO buffer and a second synchronizer. The FIFO buffer receives data with the strobe clock. The second synchronizer generates a representation of the data in response to the ASIC-generated clock.

The aforementioned references and other existing solutions may strive to provide improved input/output data transmission. Nevertheless, they still have a number of limitations and shortcomings. For example, they use a delay line to implement both coarse and fine delay tuning. However, this approach requires a lot of area and consumes a great amount of power. Furthermore, none of them discloses a receive enable logic that utilizes a variable count indication to cater for different memory protocols.

Accordingly, there remains a need to have a generic physical layer which overcomes the aforesaid problems and shortcomings.

SUMMARY OF THE INVENTION

The following presents a simplified summary of the invention in order to provide a basic understanding of some aspects of the invention. This summary is not an extensive overview of the invention. Its sole purpose is to present some concepts of the invention in a simplified form as a prelude to a more detailed description that is presented later.

It is an objective of the present invention to provide a generic physical layer which allows scaling external memory devices to higher clock speed.

It is also an objective of the present invention to provide a generic physical layer which possesses flexibility to support various preamble, interamble and postamble requirements.

It is yet another objective of the present invention to provide a generic physical layer which is capable of meeting latency requirements of different memory interface protocols.

It is also an objective of the present invention to provide a generic physical layer which utilizes a hybrid approach to achieve both coarse and fine delay tuning.

It is yet another objective of the present invention to provide a generic physical layer which employs a receive enable logic to cater for different memory protocols.

It is also an objective of the present invention to provide a generic physical layer which is capable of supporting interfacing to multi-rank external memory devices.

Further, it is also an objective of the present invention to provide a generic physical layer which is capable of handling multi-lane transfers and de-skew without additional de-skew structures.

It is yet another objective of the present invention to provide methods of interfacing with external memory devices.

Accordingly, these objectives may be achieved by following the teachings of the present invention. The present invention relates to a generic physical layer providing a unified architecture for interfacing with an external memory device. The generic physical layer comprises a transmit data path for transmitting a parallel data to the external memory device and a receive data path for receiving a serial data from the external memory device. The physical layer is characterized by a receive enable logic for masking strobe of the data, wherein the transmit data path and the receive data path each comprising a FIFO circuit, a data rotator and an adjustable-delay logic for delay tuning and a per-bit-deskew for multi-lane support.

Further, the present invention also relates to a method of transmitting a parallel data to an external memory device using the generic physical layer. The method comprises the steps of inputting the parallel data at a transmit data path, implementing coarse delay tuning by a FIFO circuit and a data rotator, and fine delay tuning by an adjustable-delay logic, serializing the parallel data, and transmitting the serialized data to an external pad.

In addition, the present invention also relates to a method of receiving a serial data from an external memory device using the generic physical layer. The method comprises the steps of inputting the serial data at a receive data path, dividing strobe of the serial data based on strobe edges including rising edges and falling edges by a divider, and implementing coarse delay tuning by a FIFO circuit and a data rotator, and fine delay tuning by an adjustable-delay logic.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

So that the manner in which the above recited features of the present invention can be understood in detail, a more particular description of the invention, briefly summarized above, may have been referred by embodiments, some of which are illustrated in the appended drawings. It is to be noted, however, that the appended drawings illustrate only typical embodiments of this invention and are therefore not to be considered limiting of its scope, for the invention may admit to other equally effective embodiments.

These and other features, benefits, and advantages of the present invention will become apparent by reference to the following text figures, with like reference numbers referring to like structures across the views, wherein.

DETAILED DESCRIPTION OF THE INVENTION

Figure 1:
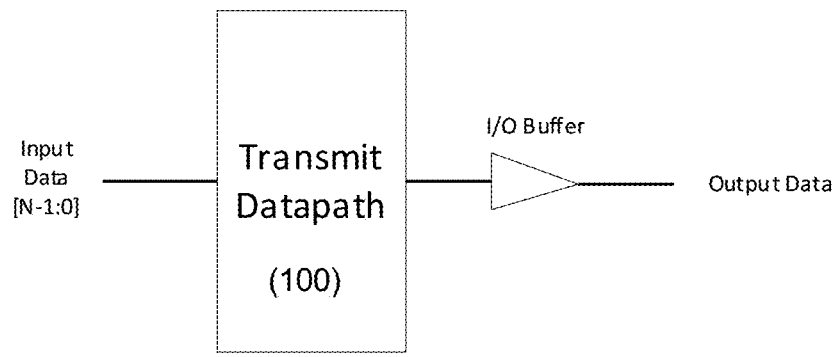
FIG. 1 illustrates a transmit data path in accordance with an embodiment of the present invention.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modifications, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field.

The present invention is described hereinafter by various embodiments with reference to the accompanying drawings, wherein reference numerals used in the accompanying drawings correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the invention.

The present invention relates to a generic physical layer providing a unified architecture for interfacing with an external memory device. Accordingly, the generic physical layer comprises a transmit data path (100) for transmitting a parallel data to the external memory device and a receive data path (200) for receiving a serial data from the external memory device, characterized by a receive enable logic (300) for masking strobe of the data. The transmit data path (100) and the receive data path (200) each comprising a FIFO circuit (4), a data rotator (2) and an adjustable-delay logic for delay tuning and a per-bit-deskew (10) for multi-lane support.

In accordance with an embodiment of the present invention, the transmit data path (100) further comprises a clock-crossing multiplexor (6) configured to select a read base index, a serializer (8) configured to serialize the parallel data, and a multi-rank logic configured to support data transmission of multiple ranks.

In accordance with an embodiment of the present invention, the receive data path (200) further comprises a divider (12) configured to divide the strobe of the data and a counter configured to extend a user read enable to cover strobe toggling.

In accordance with an embodiment of the present invention, the FIFO circuit (4) of the receive data path (200) is associated with a plurality of latches for handling strobe toggling, multi-lane data transfer and de-skew.

In accordance with an embodiment of the present invention, the receive enable logic (300) comprises a logic gate circuit.

Hereinafter, each features of the physical layer including the transmit data path (100), receive data path (200) and the receive enable logic (300) will be discussed in more details. Examples will be given for more detailed explanation. The advantages of the present invention may be more readily understood and put into practical effect from these examples. However, it is also to be understood that the following examples are not to limit the scope of the present invention in any way.

Transmit Data Path (100)

FIG. 1 illustrates a transmit data path (100) in accordance with an embodiment of the present invention. The transmit data path (100) can transfer parallel data generated from internal sources on a slower clock domain and serialize the parallel data to an external pad on a faster clock domain. The data to be transmitted is presented on the left side of the transmit data path (100) in a parallel format, in CLK_A domain. The input data can then be crossed over from CLK_A domain to CLK_B domain in the transmit data path (100) and further serialized before transmitting out to the external pad.

In the following teachings, the transmit data path (100) can be assumed to transmit an input data [N−1:0] with N equal to 4. The value of N includes but not limited to 2, 4, 8 and 16. Further, it can be assumed that the input data is transmitted bit-0 first and bit-(N−1) last. Likewise, the input data can be transmitted bit-(N−1) first and bit-0 last in other embodiments.

Figure 2:
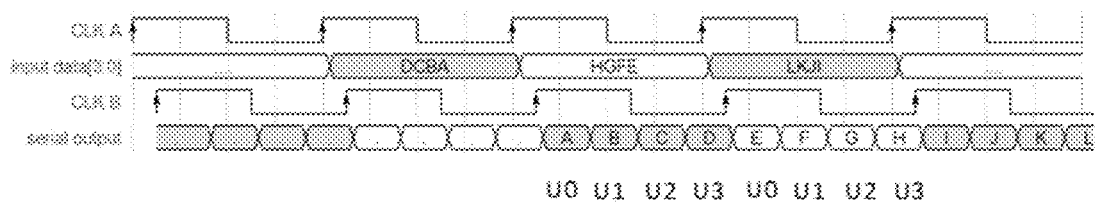
FIG. 2 illustrates a timing diagram of a transmit data path in accordance with an embodiment of the present invention.

Referring to FIG. 2, it is shown that CLK_A and CLK_B have the same clock frequency but different phases. The phase of CLK_B can further be delayed by a certain amount that is monitored by the transmit data path (100). CLK_A and CLK_B are free-running clocks. Each slot on the serial output data can be regarded as a unit interval (UI).

Figure 3:
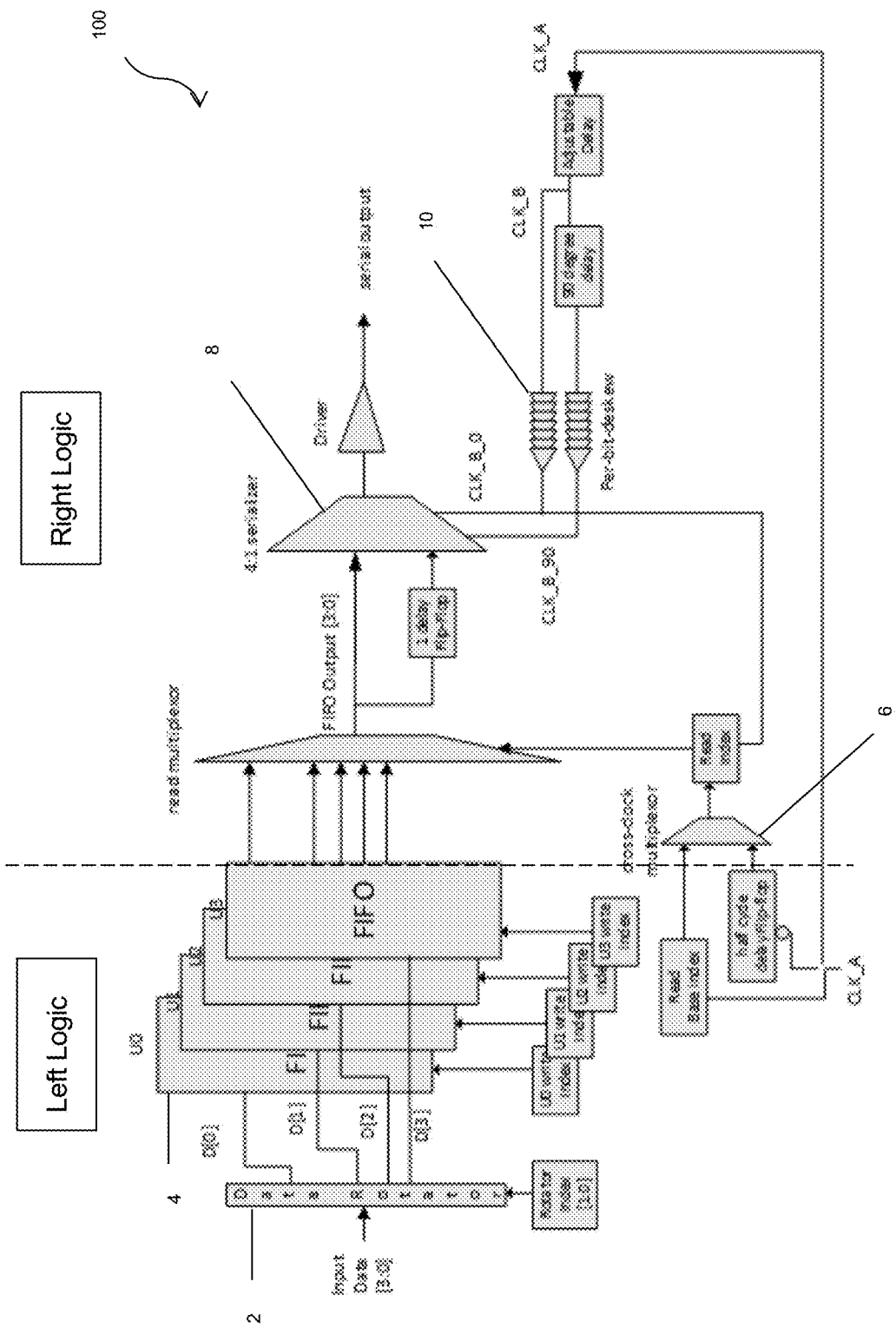
FIG. 3 is a block diagram illustrating a structure of a transmit data path in accordance with an embodiment of the present invention.

FIG. 3 is a block diagram illustrating a structure of a transmit data path in accordance with an embodiment of the present invention. The transmit data path (100) can be used for various protocols including but not limited to DDR3, DDR4, DDR5, LPDDR3, LPDDR4, LPDDR5, HBM2, HBM3 and LVDS. CLK_B can be generated from CLK_A through an adjustable-delay logic. The adjustable-delay logic comprises an adjustable delay. The adjustable-delay logic may further comprise a 90-degree delay. The adjustable delay can be implemented using a phase interpolator, a delay-locked loop (DLL) or a pure delay cell. Thereafter, CLK_B can be directed to the 90-degree delay and then to a per-bit-deskew (10) which serves as an additional fine delay to generate CLK_B_90. CLK_B can also be directed directly to the per-bit-deskew (10) to generate CLK_B_0. The 90-degree delay can be implemented using a phase interpolator, a DLL or a pure delay cell. Essentially, CLK_B_0 is a delayed version of CLK_B while CLK_B_90 is a 90-degree delayed version of CLK_B_0. Referring to FIG. 3, the transmit data path (100) can be divided into two parts, in which logic on the left can be clocked by CLK_A while logic on the right can be clocked by CLK_B.

Thereafter, the input data can enter the transmit data path (100) through a data rotator (2). The data rotator (2) and a first-in-first-out (FIFO) circuit (4) including but not limited to four FIFO units, U0-U3, can serve to delay the input data by certain UI. The data rotator (2) can be implemented using a left-rotate function. For example, when the input data is "DCBA" and the index of the data rotator (2) is one, the input data will be rotated left by one and the rotated output data will be "CBAD". Generally, the data rotator index can be 1-bit for a 2-bit input. The data rotator index can be 2-bit for a 4-bit input. The data rotator index can be 3-bit for an 8-bit input. Meanwhile, the U0-U3 write indices can be log 2 (M) bit where M is the number of entries of the FIFO units. In this embodiment, there are eight entries in each FIFO unit and thus the U0-U3 write indices are 3-bit each. The desired UI delay can refer to as a generic letter, A, in this embodiment for explanation purposes. The bit value of A can be obtained through the sum of the bit value of the data rotator index and the bit value of the U0-U3 write indices. In this embodiment, the data rotator index is 2-bit as there is a 4-bit input while the U0-U3 write indices are 3-bit each as there are eight entries in each FIFO units, thus the bit value of A is equal to 5-bit which means that there are 32 possible UI delays in the transmit data path (100). In another embodiment, the data rotator index can be 1-bit while the U0-U3 write indices can be 2-bit each, thus the bit value of A is equal to 3-bit which means that there are 8 possible UI delays in the transmit data path (100).

The data rotator index and the U0-U3 write indices can be generated by the following logic equations which is based on the present embodiment of 2-bit data rotator index and 3-bit U0-U3 write indices. It is readily understood that the following logic equations can be adjusted according to the bit value of the data rotator index and the bit value of the FIFO unit write indices.

The data rotator index=lower 2 bits of $A$, $A[1:0]$;

The $U$0 write index=write base index+upper 3 bits of $A$, $A[4:2]$+bit_wise_or($A[1:0]$);

The $U$1 write index=write base index+$A[4:2]$+second bit of $A$, $A[1]$;

The $U$2 write index=write base index+$A[4:2]$+bit_wise_and($A[1:0]$); and

The $U$3 write index=write base index+$A[4:2]$

In one example, the desired number of delays for input data "DCBA" through the transmit data path (100) is eight and thus A[4:0] is 8 UI or 5'b01000. The data rotator index and the U0-U3 write indices can be determined as follows.

The data rotator index=$A[1:0]$=0;

The $U$0 write index=write base index+$A[4:2]$+bit_wise_or($A[1:0]$)=0+2+0=2;

The $U$1 write index=write base index+$A[4:2]$+$A[1]$= 0+2+0=2;

The $U$2 write index=write base index+$A[4:2]$+bit_wise_and($A[1:0]$)=0+2+0=2; and The $U$3 write index=write base index+$A[4:2]$=0+2=2

Figure 4:
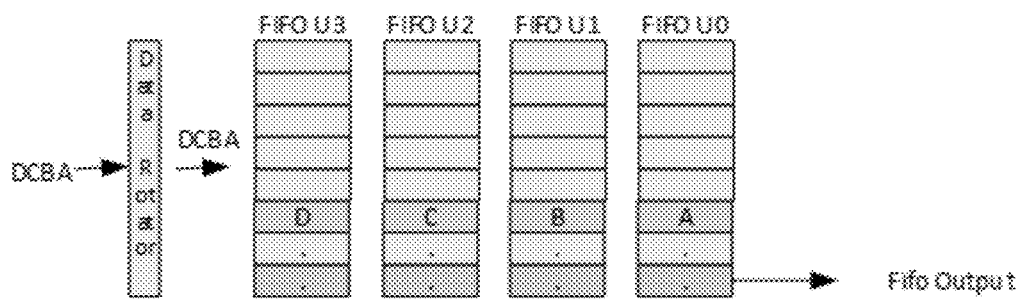
FIG. 4 illustrates an example of a FIFO operation of the transmit data path illustrated in FIG. 3.

The write base index starts from 0 and increments on every cycle. In this example, the lower 2 bits of A, A[1:0] is "00" and thus it is 0 in decimal value. The upper 3 bits of A, A[4:2] is "010" and thus it is 2 in decimal value. The value of bit_wise_or(A[1:0]) is 0 unless one or both of the first bit and the second bit of A are "1". The second bit of A, A[1] is "0" and thus it is 0 in decimal value. The value of bit_wise_and(A[1:0]) is 0 unless both of the first bit and the second bit of A are "1". Since the data rotator index is 0 and the U0-U3 write indices are 2, the input data "DCBA" will be rotated by 0 and written into entry 2 of each FIFO unit as shown in FIG. 4.

Figure 5:
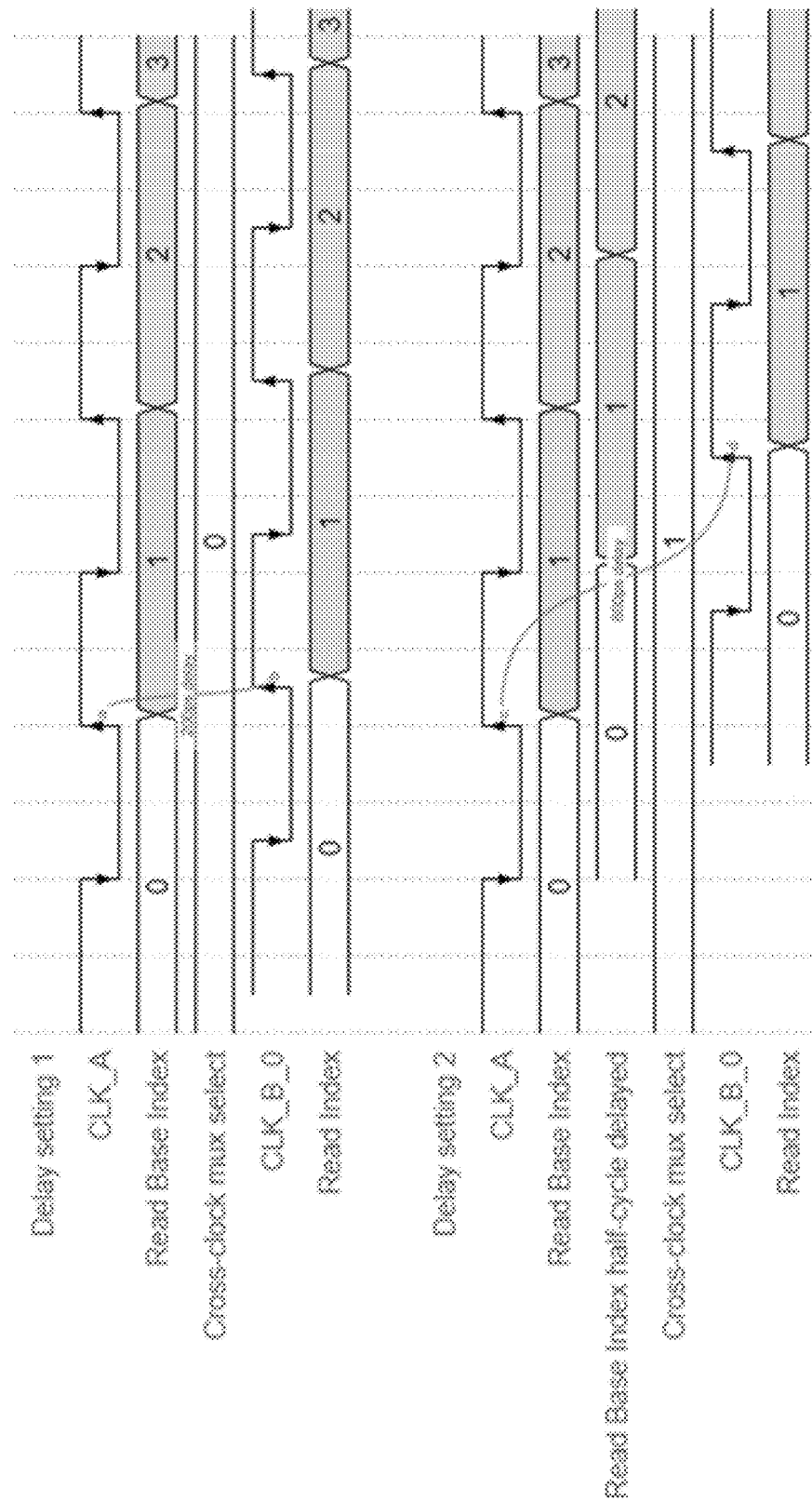
FIG. 5 illustrates a timing diagram of the transmit data path illustrated in FIG. 3 for read index clock-crossing.

Referring to FIG. 5, the read base index in the CLK_A domain starts from 0 and increments on every clock cycle. The read base index is copied over to the read index in the CLK_B_0 domain. CLK_B_0 delay is adjusted in such a way that it is 200 ps delayed from CLK_A. A clock-crossing multiplexor (6) shown in FIG. 3 is used to select between the read base index itself or the half-cycle-delayed read base index. In an example where the adjustable delay for CLK_B_0 is set to "Delay setting 1", the clock-crossing multiplexor (6) select is set to 0 and thus read base index at CLK_A domain is copied over to read index at CLK_B_0 domain. In another example where the adjustable delay for CLK_B_0 is set to "Delay setting 2", the clock-crossing multiplexor (6) select is set to 1 and thus the half-cycle-delayed read base index at CLK_A domain is copied over to read index at CLK_B_0. The clock-crossing multiplexor (6) select can be set based on CLK_B_0 total delay with respect to CLK_A in order to prevent any timing violations when crossing from CLK_A domain to CLK_B_0 domain.

Figure 6:
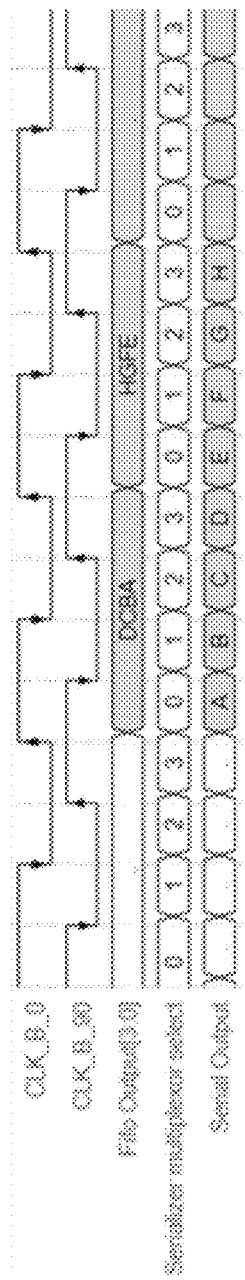
FIG. 6 illustrates a timing diagram of the transmit data path illustrated in FIG. 3 for serialized output.

Subsequently, the read index can be used to read out data from the 4 FIFO units. Entry 0 of the FIFO units will be read out first as the read index is 0. The serializer (8) utilizes both CLK_B_0 and CLK_B_90 as "select" for a multiplexor and select 1 out of the 4 bits of FIFO output data to achieve a 4:1 serialization as shown in FIG. 6.

Figure 7:
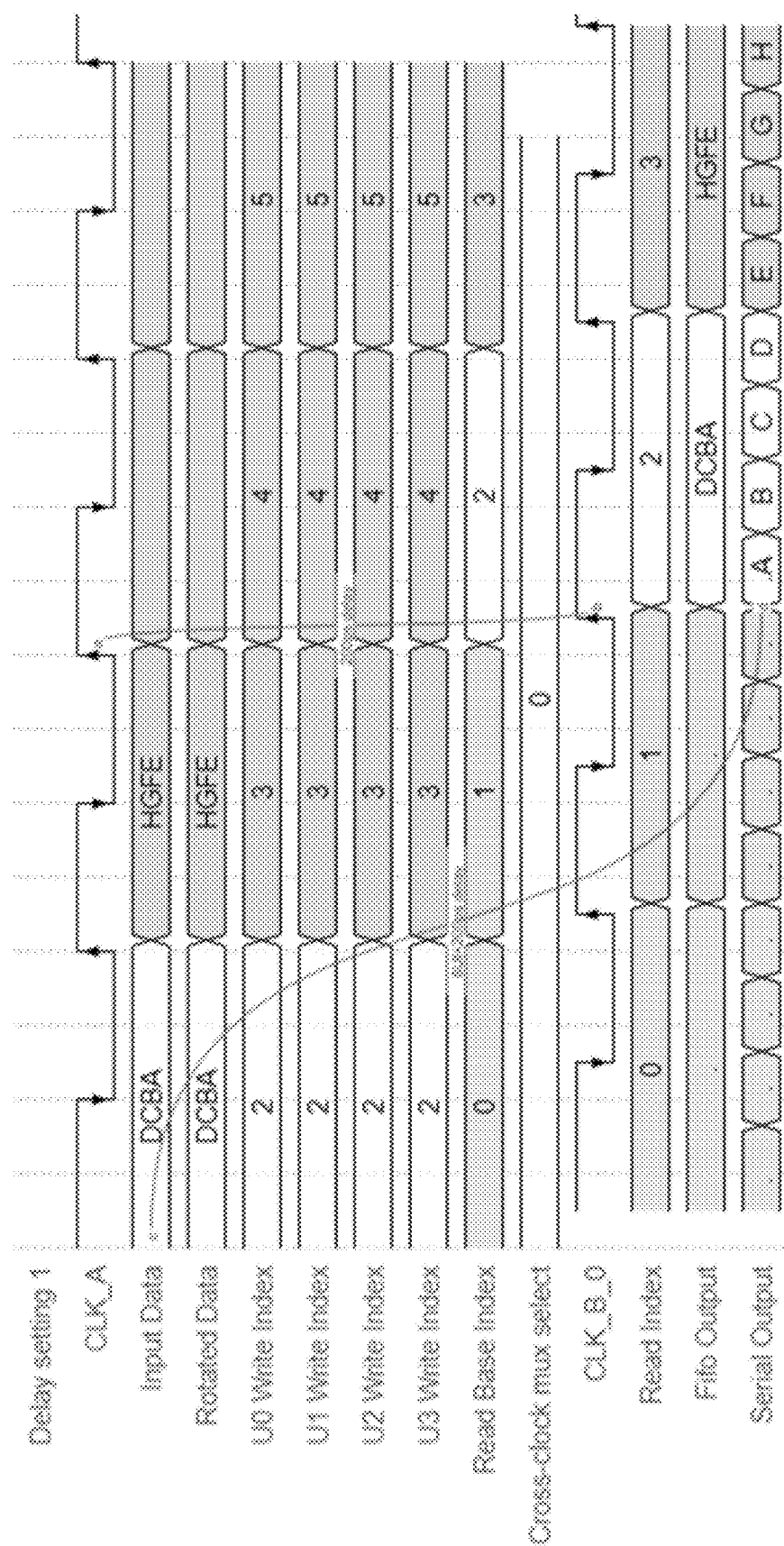
FIG. 7 illustrates a first overall timing diagram of the transmit data path illustrated in FIG. 3.

Referring to FIG. 7, the rotator index remains the same at 0. Hence, new input data is always written into the next entry of the FIFOs U0-U3. In every CLK_B_0 cycle, the read index is copied over to the read index in the CLk_B_0 domain via the clock-crossing multiplexor (6) as outlined in the earlier section. 2 CLK_A cycles later, the read base index would have incremented to 2. The read index at CLK_B_0 domain becomes 2 as well. The data 'DCBA' will then appear on the output of the FIFOs and is then serialized. The transmit data path (100) has thus achieved a total of 8 UI+200 ps delay between the input and output.

In another example, the desired delay for input data "DCBA" through the transmit data path (100) is nine and thus A[4:0] is 9 UI or 5'b01001. The data rotator (2) can be implemented using a right-rotate function. The data rotator index and the U0-U3 write indices can be determined as follows.

The data rotator index=$A[1:0]$=1;

The $U$0 write index=write base index+$A[4:2]$+bit_wise_or($A[1:0]$)=0+2+1=3;

The $U$1 write index=write base index+$A[4:2]$+$A[1]$= 0+2+0=2;

The $U$2 write index=write base index+$A[4:2]$+bit_wise_and($A[1:0]$)=0+2+0=2; and The $U$3 write index=write base index+$A[4:2]$=0+2=2

Figure 8:
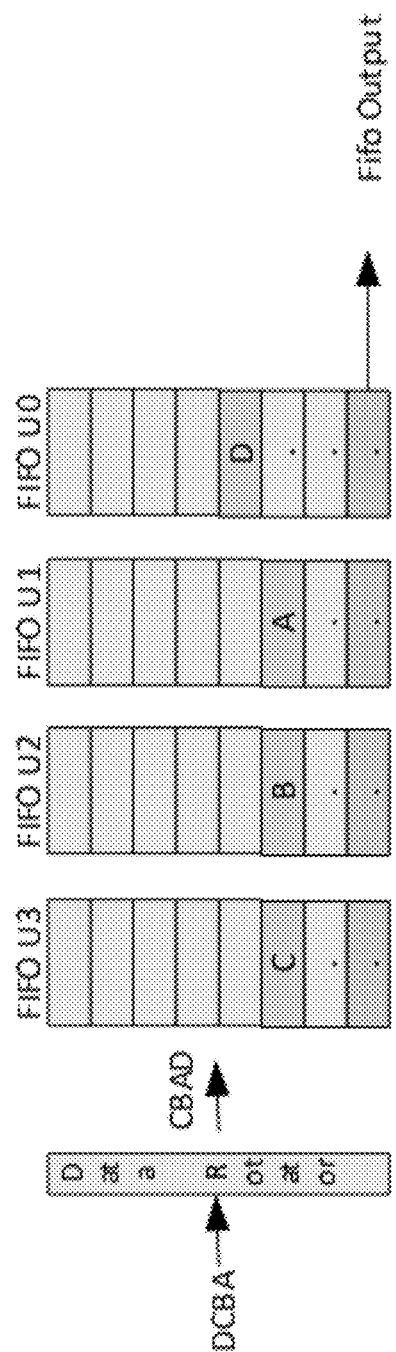
FIG. 8 illustrates a second example of a FIFO operation of the transmit data path illustrated in FIG. 3.

Since the data rotator index is 1 and the data rotator (2) is implemented using a right-rotate function, the input data "ABCD" is rotated right as "DABC". "D" is written into entry 3 of the FIFO U0 while "ABC" are written into entry 2 of FIFO U1-U3 each accordingly as shown in FIG. 8.

Figure 9:
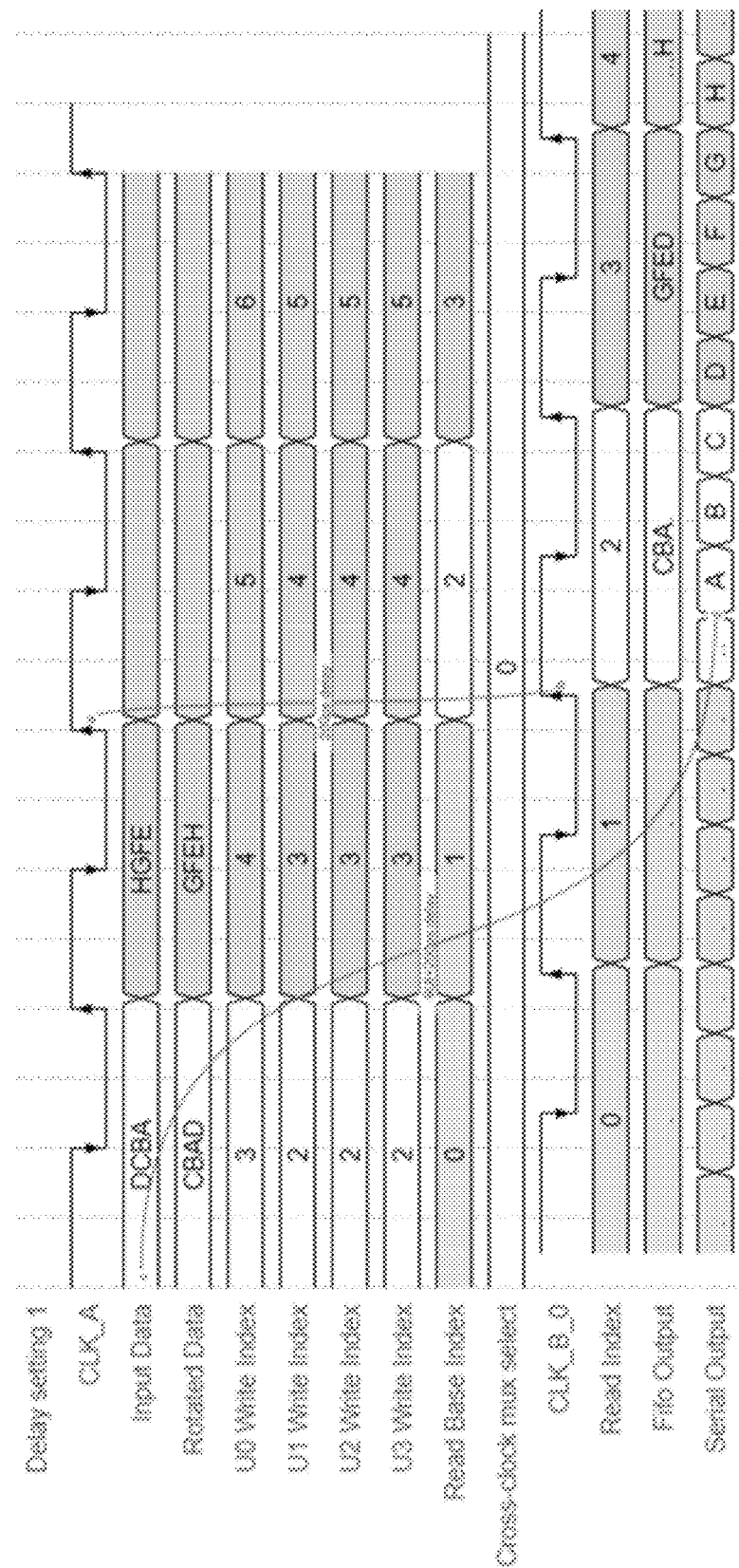
FIG. 9 illustrates a second overall timing diagram of the transmit data path illustrated in FIG. 3.

Referring to FIG. 9, read base index starts from 0 and increments on every cycle. On every cycle, the U0-U3 write indices and read base index are incremented by 1. The rotator index stays at 1. 2 clock cycles later, "CBA" is read out from the FIFO using read index at CLK_B_0. 1 more clock cycle later, "D" is read out from the FIFO using read index at CLK_B_0. The transmit data path (100) has thus achieved a total of 9 UI+200 ps delay between the input and output. Hence, by manipulating the data rotator (2), the U0-U3 write indices, and the clock delay of CLK_B_0, the present invention is capable of achieving various delays from input data to final serial output.

Figure 10:
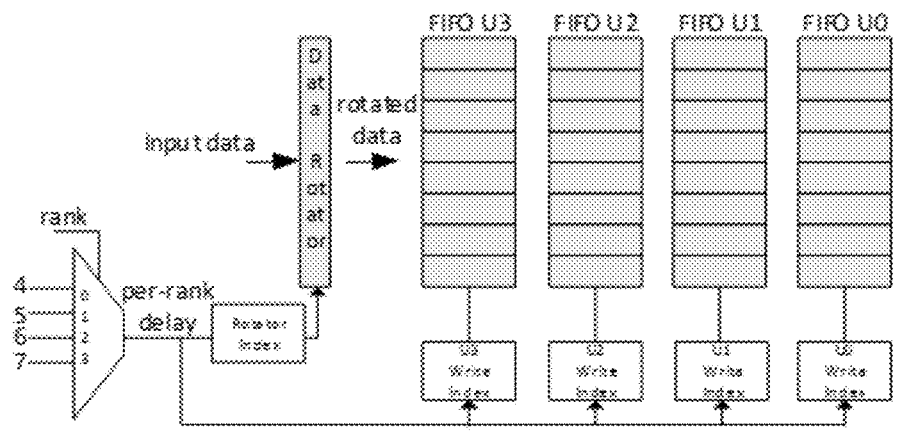
FIG. 10 illustrates a multi-rank logic for a transmit data path in accordance with an embodiment of the present invention.

In accordance with an embodiment of the present invention, the external pad has to be connected to different devices or ranks and thus different delays are required. For example, one set of data has to be transmitted to one device with a delay of 4 UI while another set of data has to be transmitted to another device with a delay of 7 UI. This can be achieved through changing the rotator index and the U0-U3 write indices for each device. FIG. 10 shows a multi-rank logic in association with the transmit data path (100) for supporting multi-rank transmit.

Referring to FIG. 10, the multi-rank logic can be used to determine which devices the data is transmitting to and assign appropriate rotator index and write indices for each device. In one example, rank-0 requires a delay of 4 UI, rank-1 requires a delay of 5 UI, rank-2 requires a delay of 6 UI and rank-3 requires a delay of 7 UI. The data rotator (2) can be implemented using a left-rotate function. In the first cycle, input data of "DCBA" is transmitted to rank-0 with a delay of 4 UI and thus A[4:0] is 4 UI or 5'b00100. Write base index starts from 0.

The data rotator index=$A[1:0]$=0. So the rotated data is still "DCBA".

The U0 write index=write base index+$A[4:2]$+bit_wise_or($A[1:0]$)=0+1+0=1;

The U1 write index=write base index+$A[4:2]$+$A[1]$= 0+1+0=1;

The U2 write index=write base index+$A[4:2]$+bit_wise_and($A[1:0]$)=0+1+0=1; and The U3 write index=write base index+$A[4:2]$=0+1=1

In the second cycle, input data of "HGFE" is transmitted to rank-1 with a delay of 5 UI and thus A[4:0] is 5 UI or 5'b00101. Write base index increments to 1.

The data rotator index=$A[1:0]$=1. So the rotated data is "GFEH".

The U0 write index=write base index+$A[4:2]$+bit_wise_or($A[1:0]$)=1+1+1=3;

The U1 write index=write base index+$A[4:2]$+$A[1]$= 1+1+0=2;

The U2 write index=write base index+$A[4:2]$+bit_wise_and($A[1:0]$)=1+1+0=2; and The U3 write index=write base index+$A[4:2]$=1+1=2

In the third cycle, input data of "LKJI" is transmitted to rank-3 with a delay of 7 UI and thus A[4:0] is 7 UI or 5'b00111. Write base index increments to 2.

The data rotator index=$A[1:0]$=3. So the rotated data is "ILKJ".

The U0 write index=write base index+$A[4:2]$+bit_wise_or($A[1:0]$)=2+1+1=4;

The U1 write index=write base index+$A[4:2]$+$A[1]$= 2+1+1=4;

The U2 write index=write base index+$A[4:2]$+bit_wise_and($A[1:0]$)=2+1+1=4; and The U3 write index=write base index+$A[4:2]$=2+1=3

Figure 11:
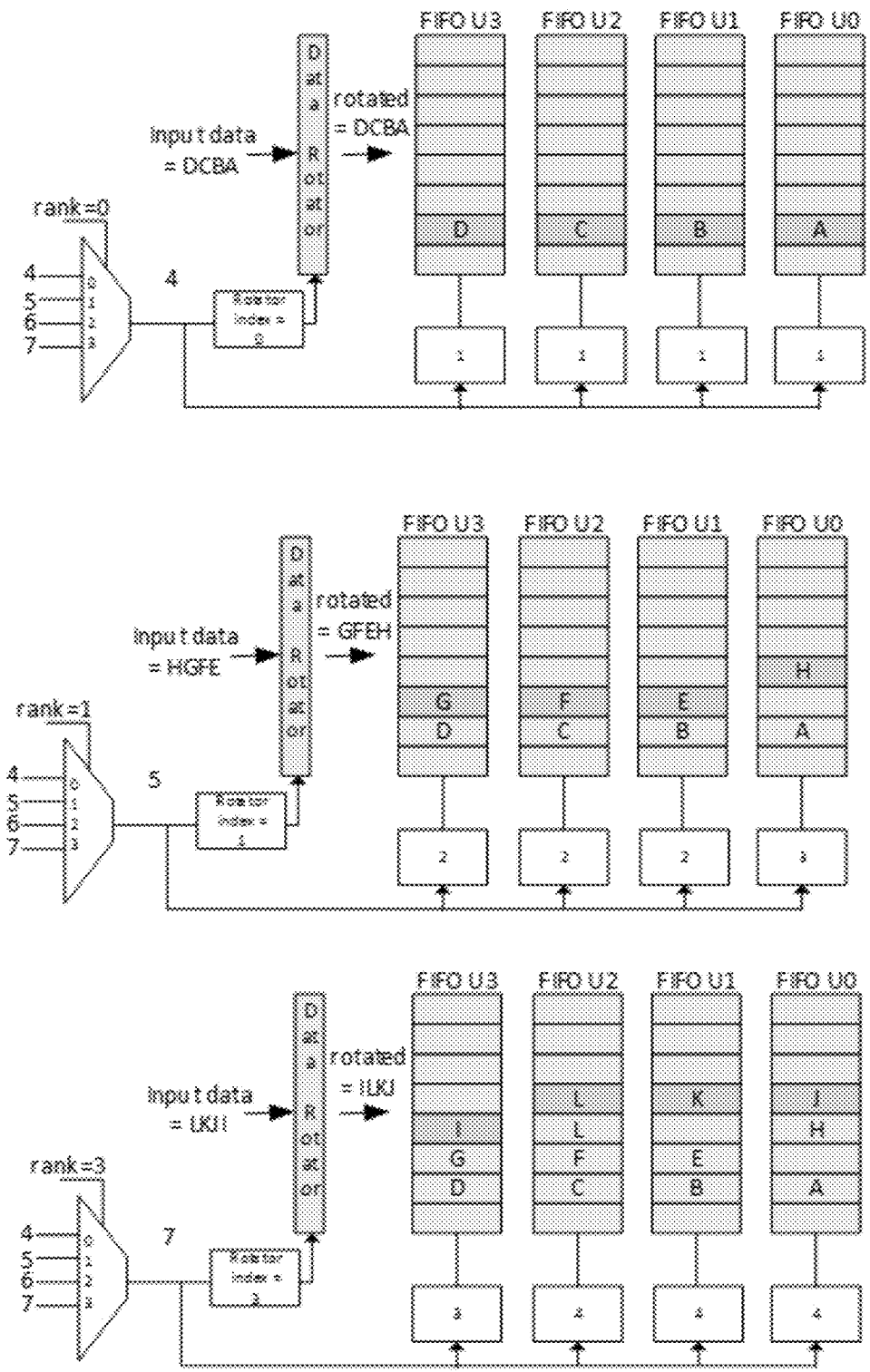
FIG. 11 illustrates the operation of the FIFO units to achieve the different UI delays for different ranks in accordance with an embodiment of the present invention.

FIG. 11 illustrates the above-mentioned operation of the FIFO units to achieve the different UI delays for different ranks.

Figure 12:
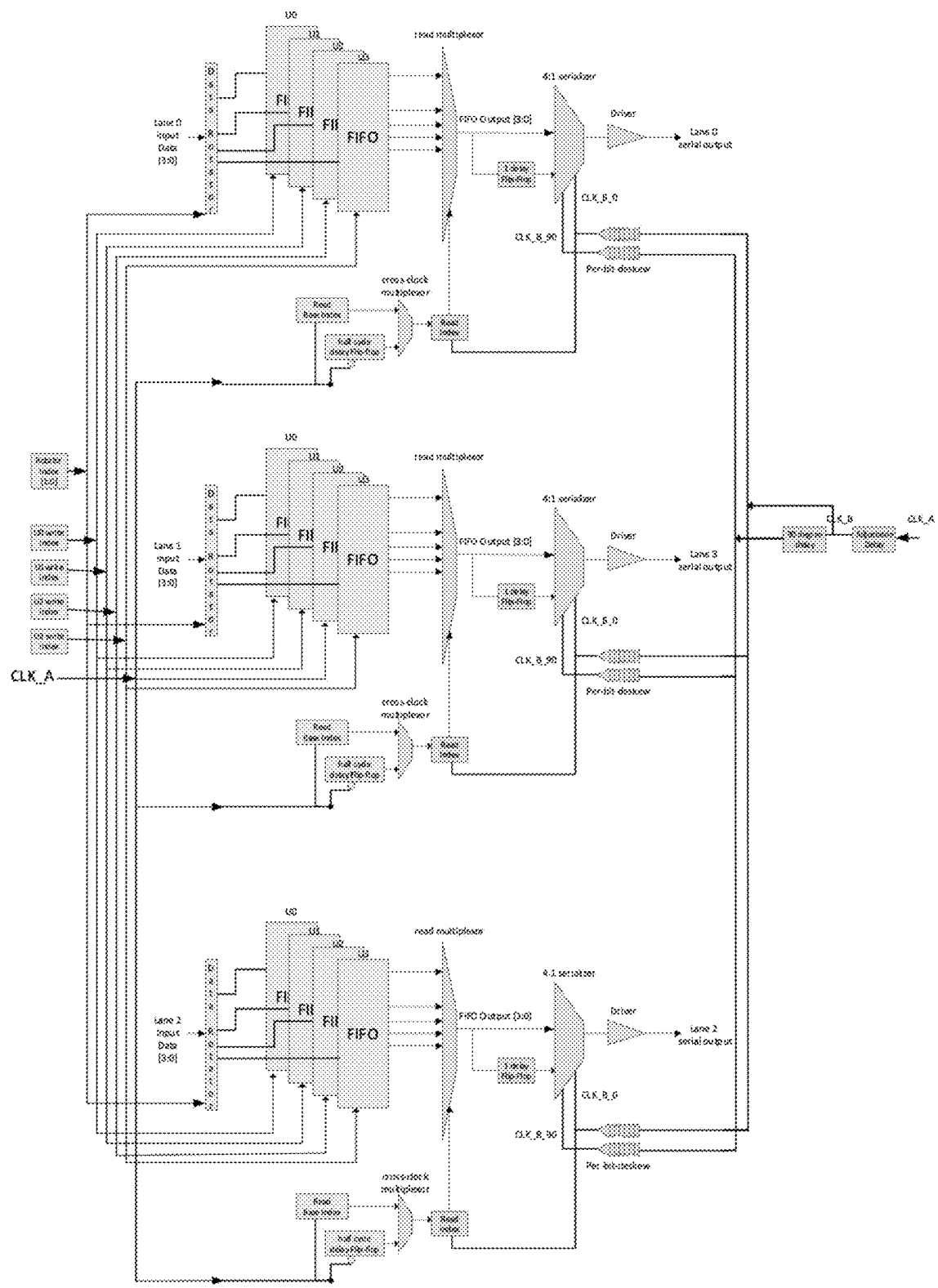
FIG. 12 illustrates a multi-lane logic for a transmit data path in accordance with an embodiment of the present invention.

In accordance with an embodiment of the present invention, it is possible to have several data lanes with each lane having N-bit parallel input data and 1 serial output. Each lane may have different clocks. Therefore, each lane may need to adjust the clock slightly different and thus it renders the use of the per-bit-deskew (10) for each lane. Referring to FIG. 12, the rotator index and FIFO U0-U3 write indices are generated centrally and distributed to all the lanes. Meanwhile, the clock-crossing multiplexor (6) is implemented locally for every lane. This configuration allows for coarse delay tuning through the FIFO units as well as the data rotator (2), and fine delay tuning through the adjustable-delay logic. This configuration also minimizes the latency through the transmit data path (100) as the FIFO read index is directly clocked by CLK_B. In other words, clock crossing directly happens at the read index. Implementing in this configuration, clock crossing is not required to happen at the data output of the FIFO units. Further, additional pipe stages, which may incur additional latency and area, are not required. This configuration also allows reduction in area and power because the adjustable-delay logic which is normally implemented with phase interpolator can be made smaller since the coarse delay is already handled by the FIFO units and the data rotator (2).

Receive Data Path (200)

Figure 13:
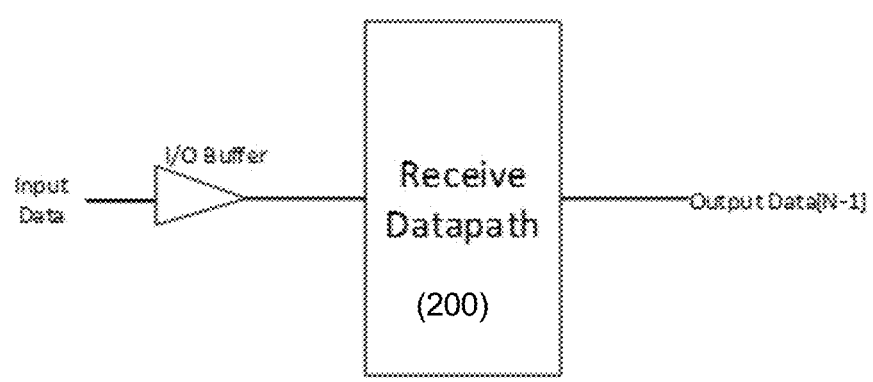
FIG. 13 illustrates a receive data path in accordance with an embodiment of the present invention.
Figure 14:
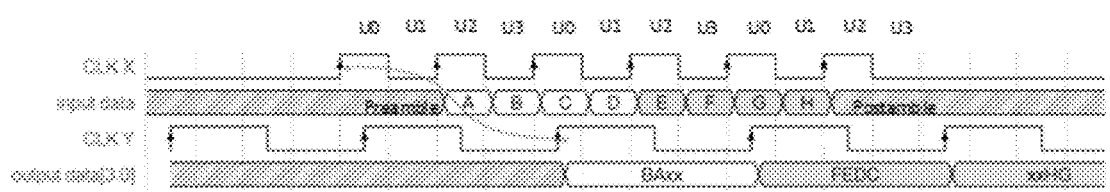
FIG. 14 illustrates a timing diagram of a receive data path in accordance with an embodiment of the present invention.

FIG. 13 illustrates a receive data path (200) in accordance with an embodiment of the present invention. The receive data path (200) can capture serial data from the external pad and convert the serial data into parallel form. The data to be captured is presented on the left side of the receive data path (200) in serial format, in the CLK_X domain. The input data is captured by the receive data path (200), and then crossed over from CLK_X domain to CLK_Y domain, before being sent for internal consumption in parallel format. In the following teachings, the receive data path (200) can be assumed to receive an input data [N−1:0] with N equal to 4. The value of N includes but not limited to 2, 4, 8 and 16. Referring to FIG. 14, CLK_X and CLK_Y do not have the same clock frequency. Also, CLK_Y and CLK_X have different clock phases.

Figure 15:
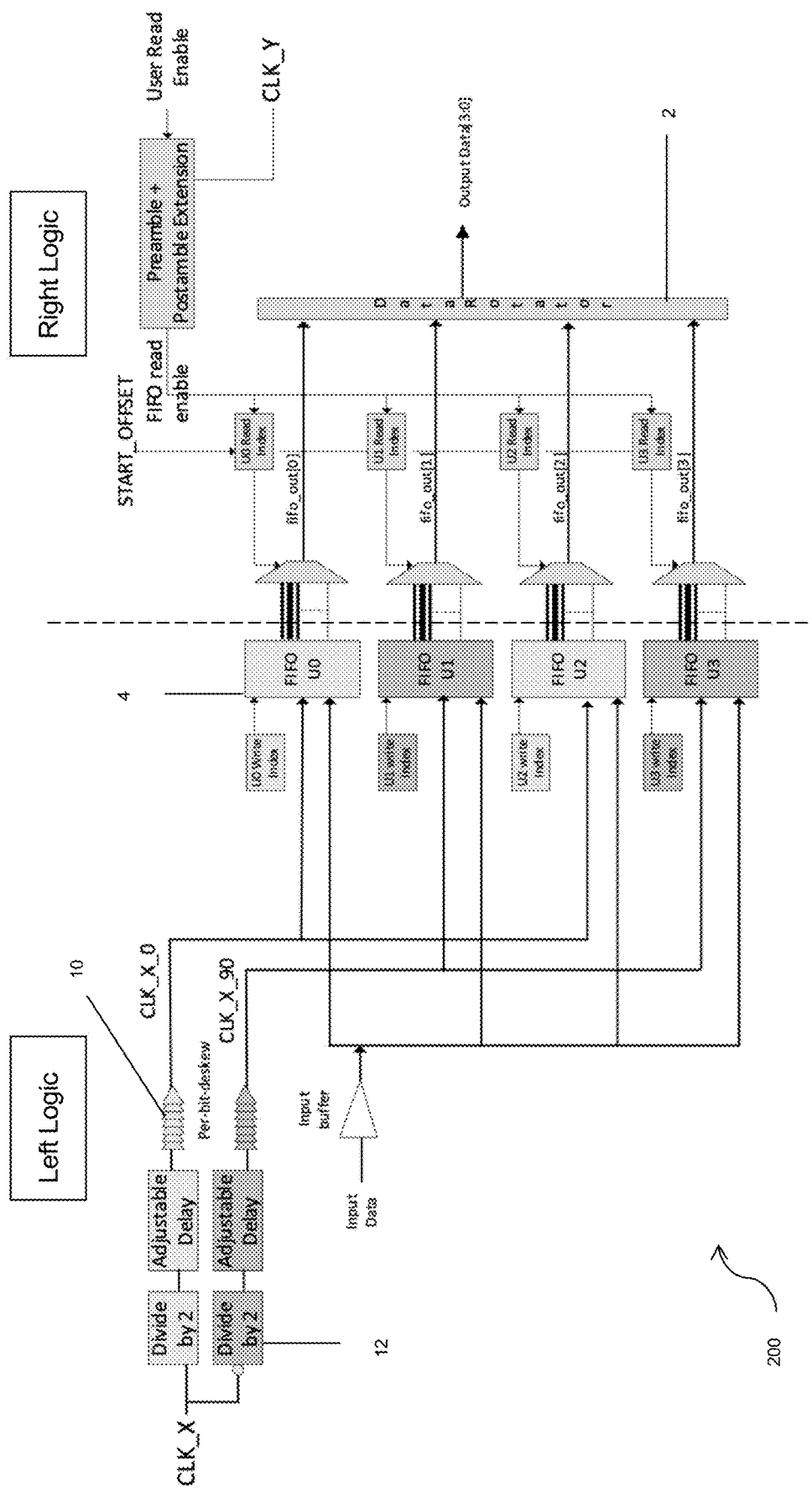
FIG. 15 is a block diagram illustrating a structure of a receive data path in accordance with an embodiment of the present invention.

FIG. 15 is a block diagram illustrating a structure of a receive data path in accordance with an embodiment of the present invention. The receive data path (200) can be used for various protocols including but not limited to DDR3, DDR4, DDR5, LPDDR3, LPDDR4, LPDDR5, HBM2, HBM3 and LVDS. A first divider (12) divides an input clock CLK_X based on the rising edges of CLK_X while a second divider (12) divides the input clock CLK_X based on the falling edges of CLK_X. Thereafter, outputs from the dividers (12) are respectively directed to an adjustable-delay logic and an optional per-bit-deskew (10) to generate CLK_X_0 and CLK_X_90. The adjustable-delay logic can be implemented using a phase interpolator, a DLL or a pure delay cell. Referring to FIG. 15, left logic can be clocked by CLK_X_0 and CLK_X_90 while right logic can be clocked by CLK_Y.

Figure 16:
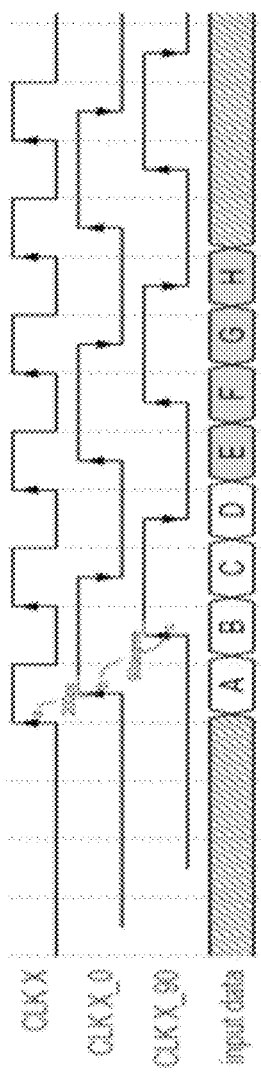
FIG. 16 illustrates the clock position of each clock of a receive data path in accordance with an embodiment of the present invention.

FIG. 16 illustrates clock position of each clock in accordance with an embodiment of the present invention. The purpose of applying the adjustable-delay logic on CLK_X is to align CLK_X to the centre of the data window. CLK_X_0 is divided by 2 from CLK_X and has a 200 ps delay after going through the adjustable-delay logic and the optional per-bit-deskew (10). CLK_X_90 is 90 degrees shifted from CLK_X_0. It can be seen that every edge of CLK_X_0 and CLK_X_90 is aligned to the centre of the data window in FIG. 16.

Figure 17:
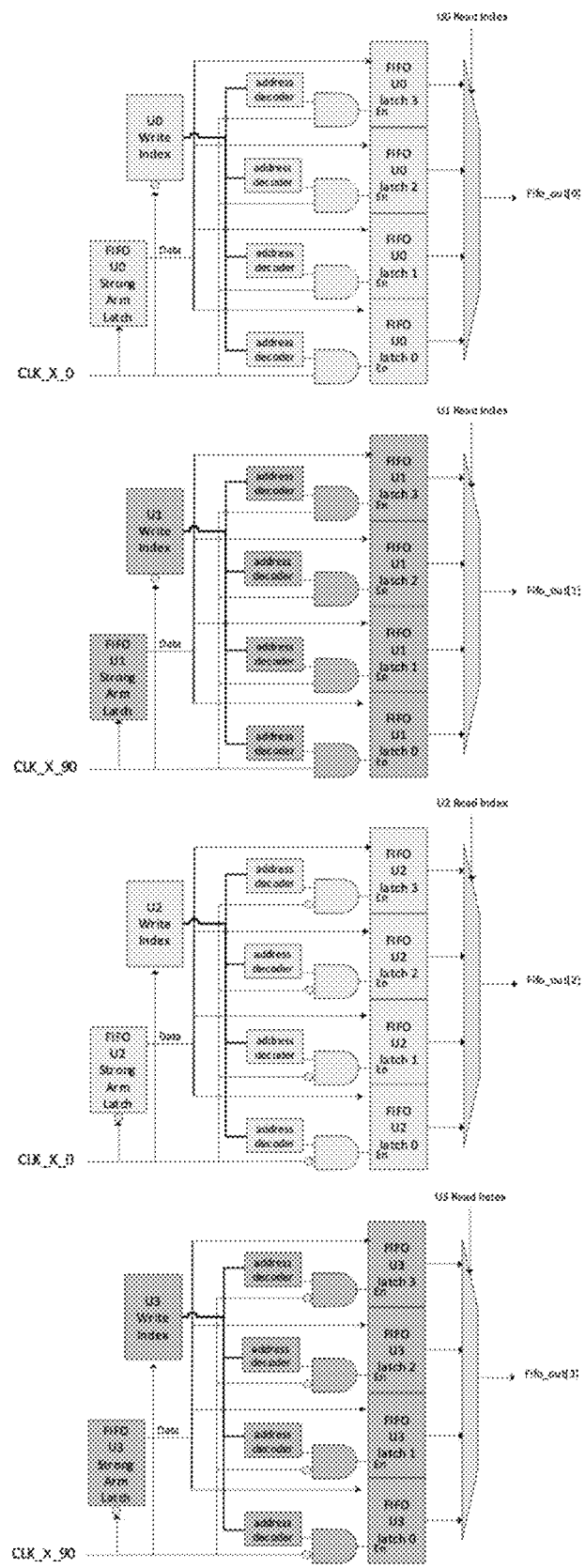
FIG. 17 illustrates a FIFO circuit implemented with a plurality of latches in a receive data path in accordance with an embodiment of the present invention.
Figure 18:
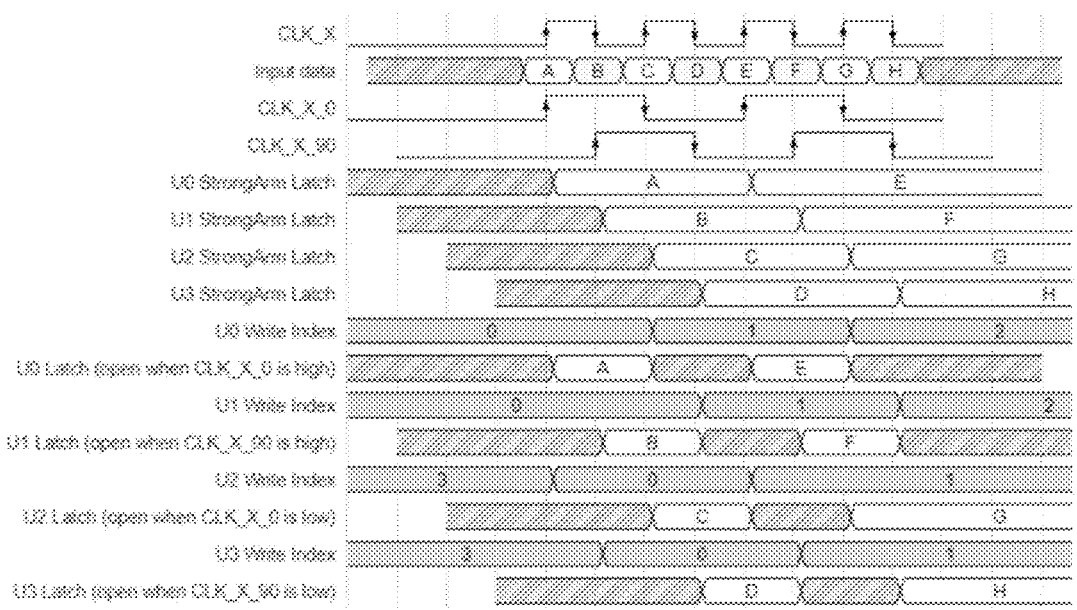
FIG. 18 illustrates a relationship between the clocks and the latches of the receive data path illustrated in FIG. 17.

Referring to FIGS. 15 and 17, the FIFO units in the FIFO circuit (4) can each be implemented with an array of flip-flops or latches. Alternatively, each FIFO unit can be further coupled with a first stage strong arm latch in conjunction with the array of latches. In both aforesaid embodiments, both high/low phases of CLK_X_0 and CLK_X_90 are used to sample input data into the FIFO units U0-U3 and to increment the U0-U3 write indices. FIG. 17 shows an embodiment where the FIFO units are coupled with the first stage strong arm latch and the array of latches. Strong arm latch is more reliable when sampling high speed data and it is less susceptible to noise. FIG. 18 illustrates a relationship between the clocks and the latches in accordance with FIG. 17. The strong arm latch of FIFO U0 can be clocked by the rising edges of CLK_X_0 while the latches of FIFO U0 are transparent during the high phase of CLK_X_0. The U0 write index can be clocked by the falling edges of CLK_X_0. Similar mechanism may work for U1-U3 FIFO units as shown in FIG. 18, albeit at different clock edges of CLK_X_0 or CLK_X_90. In another embodiment, instead of using binary-values for the U0-U3 write indices, one hot ring counter can be used in lieu of the write index and decoders.

Figure 19:
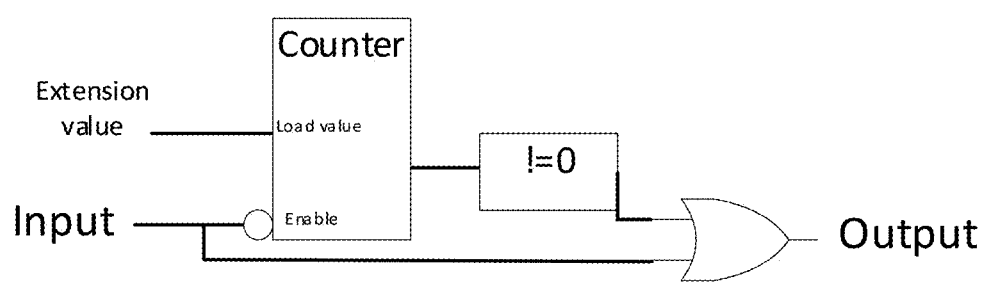
FIG. 19 illustrates a counter in a receive data path in accordance with an embodiment of the present invention.

Thereafter, once the input data has been captured into the FIFOs U0-U3, the data can be read out after the FIFO data is stable. Reading out from the FIFO can be from the CLK_Y clock domain. A user read enable input can be asserted to indicate read out from the FIFO units. In certain settings, the user read enable input has to be extended so as to cover strobe toggling such as preambles, interambles and postambles. In an example where there are 1 cycle of preamble and 1 cycle of postamble, a FIFO read enable can be generated, which is extended from the user read enable input by 2 CLK_Y cycles. If the user read enable has to be extended by a certain number of cycles, it can be achieved through the use of a counter. FIG. 19 shows the implementation of the counter. The counter is enabled by the invert of the input. When input is high, counter will be loaded with an extension value. When input is low, the counter will start to decrement from the extension value. The output is asserted high when input is high or the counter value is not 0. Once the counter value becomes 0 and the input is low, the output is asserted low.

Figure 20:
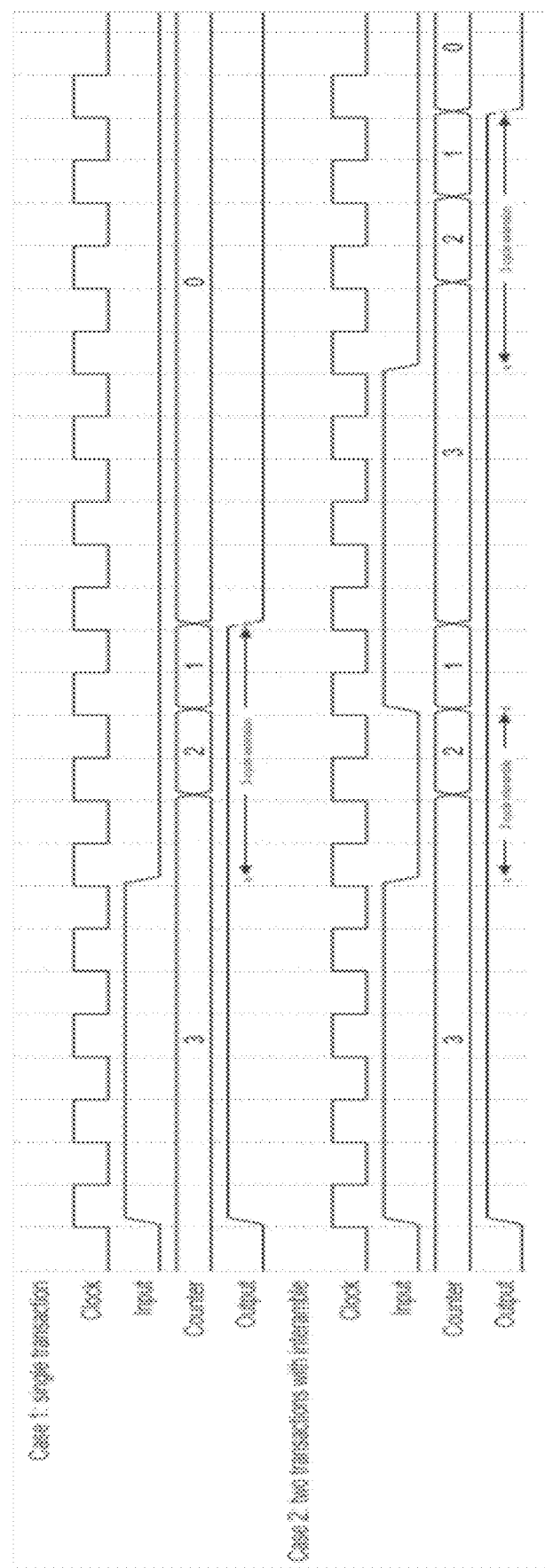
FIG. 20 illustrates a timing diagram with interambles of a receive data path in accordance with an embodiment of the present invention.

Two cases of using the counter are illustrated in FIG. 20. Case 1 shows that the counter can extend the output which corresponds to the FIFO read enable by desired cycles. Case 2 shows that when there are 2 consecutive high pulses of the input, the output will get asserted high in between the 2 high pulses of the input. This is the case of interambles. The counter can be used to extend a user read enable to cover preambles and postambles, by driving the user read enable into the input of the counter and taking the sum of preambles and postambles as the extension value.

Figure 21:
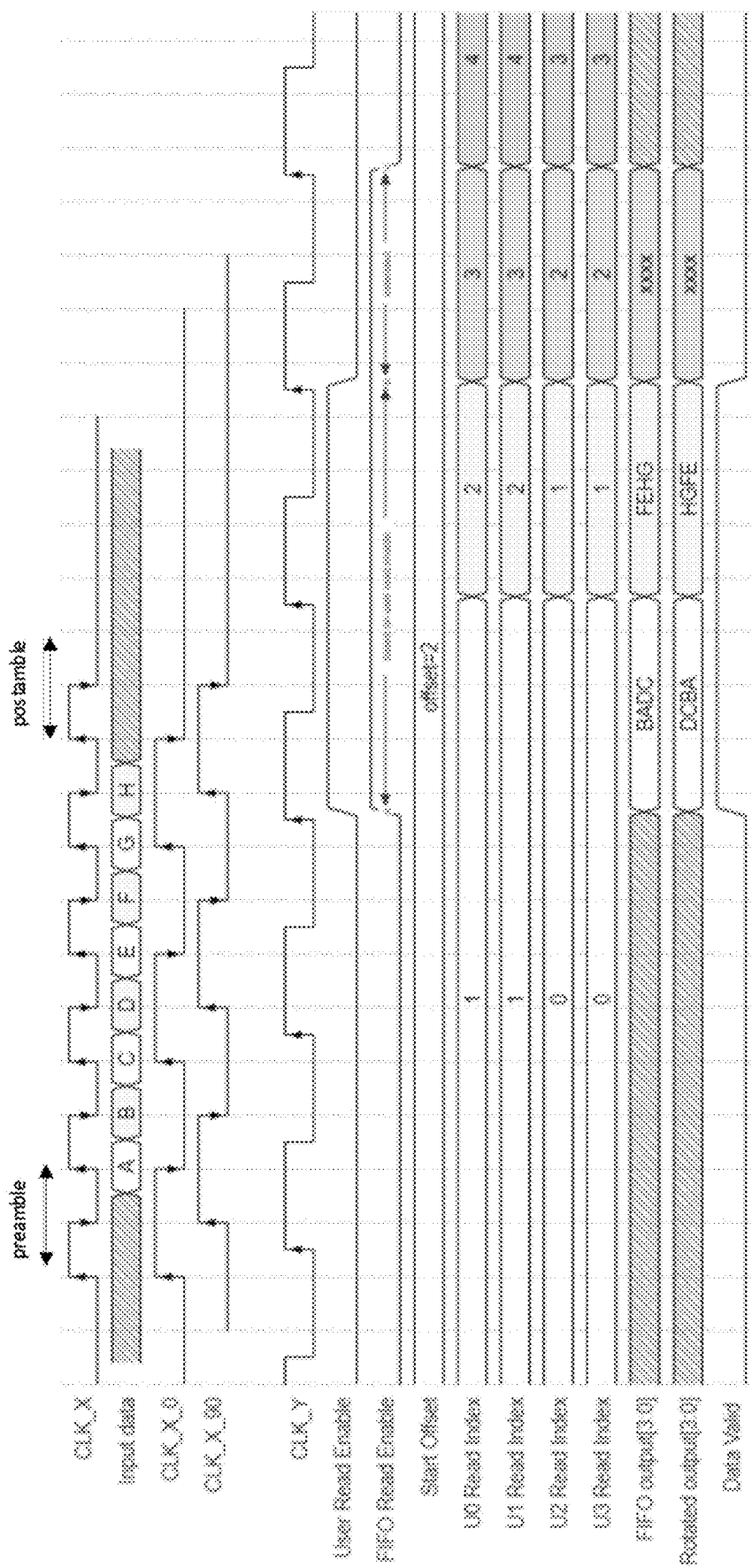
FIG. 21 illustrates a timing diagram with a preamble and a postamble of a receive data path in accordance with an embodiment of the present invention.

FIG. 21 illustrates the case where there are 1 preamble cycle and 1 postamble cycle. Using the counter, the FIFO read enable can be extended by 1 CLK_Y where 1 CLK_Y is equal to 2 CLK_X.

Figure 22:
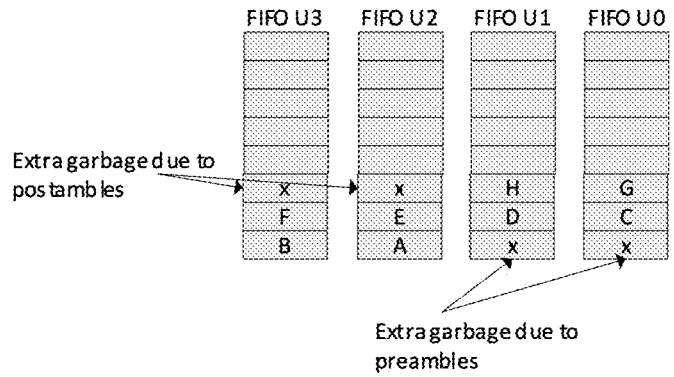
FIG. 22 illustrates a FIFO operation of a receive data path in accordance with an embodiment of the present invention.
Figure 23:
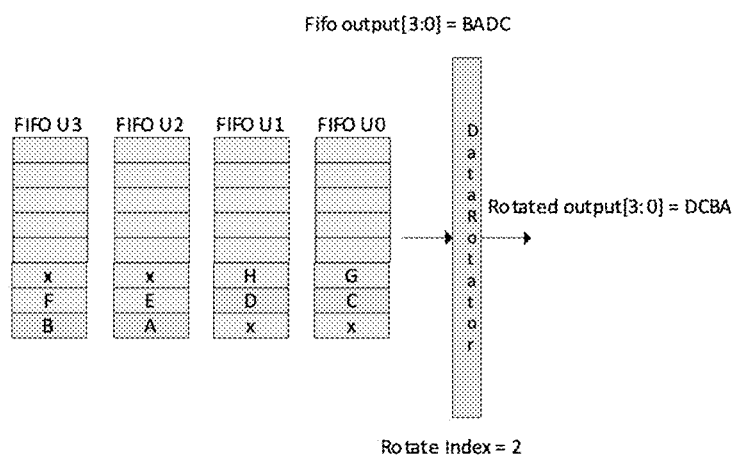
FIG. 23 illustrates a first FIFO readout in accordance with FIG. 22.
Figure 24:
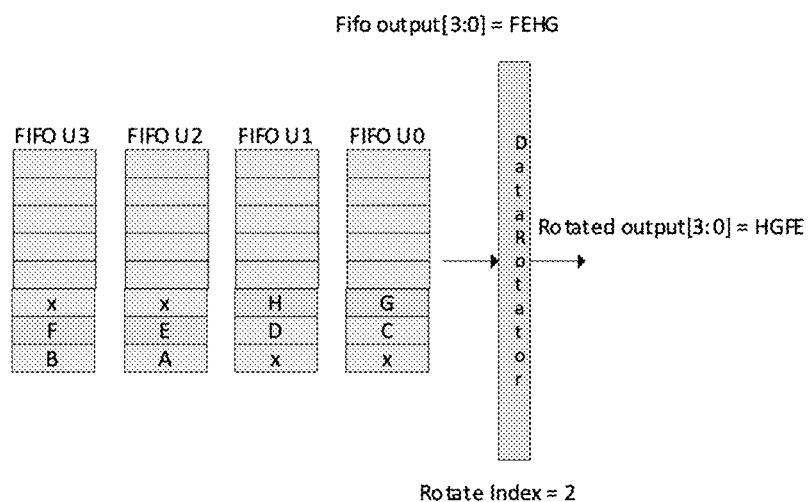
FIG. 24 illustrates a second FIFO readout in accordance with FIG. 22.

Referring to FIG. 22, the serial data has been captured into the FIFO units. U0 FIFO's entry-0 and U1 FIFO's entry-0 both are stored with garbage data "X" because of preambles. Actual data starts at U2 FIFO's entry-0. Accordingly, START_OFFSET can be set as 2. U0 Read Index is initialized to 0+bit_wise_or(START_OFFSET[1:0]). If START_OFFSET is set as 2 or "10" in binary value, U0 Read Index is initialized to 0+1=1. U1 Read Index is initialized to 0+START_OFFSET[1]. If START_OFFSET is set as 2, then U1 Read Index is initialized to 0+1=1. U2 Read Index is initialized to 0+bit_wise and(START_OFFSET[1:0]). If START_OFFSET is set as 2, U2 Read Index is initialized to 0+0=0. U3 Read Index is always initialized to 0 regardless of START_OFFSET. Thus, during the first cycle when the FIFO read enable is high, U0 Read Index=1, U1 Read Index=1, U2 Read Index=0, and U3 Read Index=0 are read. The data rotator (2) can be implemented with right rotate function in this case. The rotator index can be set as the START_OFFSET[1:0], which is 2 in this case. Hence the output from the FIFO, "BADC" is right-rotated by 2 to become "DCBA", which is in agreement with the expected output of a serial input stream of "A, B, C, D". At the same time, the user read enable input is sent back to the user as data valid qualifier, which means that the rotated output of "DCBA" is valid data. From then onwards, on every cycle, U0-U3 read indices are incremented by 1 as long as the FIFO read enable is high. The Rotator index is held at START_OFFSET[1:0] which is 2 on every cycle. In the next cycle, the FIFO output of "FEHG" will be rotated and become 'HGFE' as shown in FIG. 24, which is in agreement with the expected output of the serial input stream of "E, F, G, H". At the same time, the user read enable input is sent back to the user as data valid qualifier, which means that the rotated output of "HGFE" is valid data.

Figure 25:
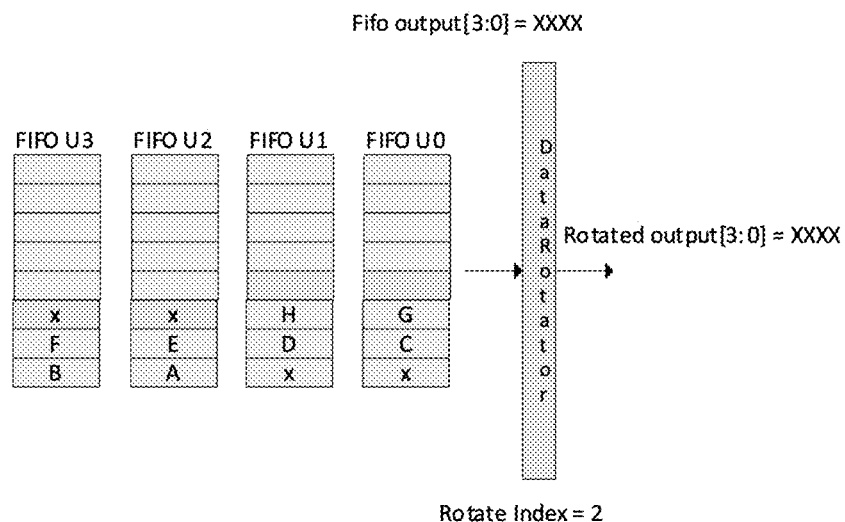
FIG. 25 illustrates a third FIFO readout in accordance with FIG. 22.

In the next cycle, the FIFO output will be "XXXX" as illustrated in FIG. 25. Regardless of rotation, this is not valid data. Since the user read enable input is continuously sent back to the user for data validation, at this cycle, the user read enable is 0 and thus it invalidates the output data. Since the FIFO read enable has gone low, the U0-U3 read indices will hold their values and no longer increment.

Figure 26:
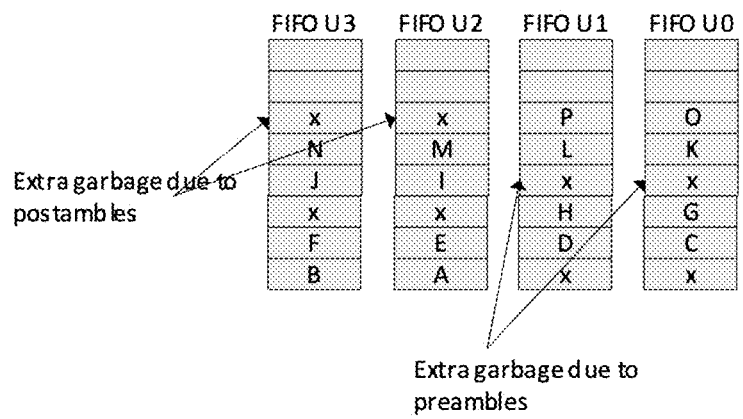
FIG. 26 illustrates a subsequent FIFO operation in accordance with FIG. 22.

The aforementioned method can continue to work for subsequent input data. For example, the next input stream of 'I, J, K, L, M, N, O, P' will occupy the following entries in the FIFO units as shown in FIG. 26. If the user read enable is asserted, the FIFO read enable will again be extended, and the U0-U3 read indices will increment from their previous values. Therefore, U0 read index is at 4, U1 read index is at 4, U2 read index is at 3, and U3 read index is at 3. The FIFO output [3:0] is then "JILK". After rotation by 2, the output data will be "LKJI", which is in agreement with the expected output of the input stream of "I, J, K, L". In the next cycle, the FIFO output will be "NMPO", and after rotation, the output is then "PONM", which is in agreement with the expected output of the input stream of "M, N, O P".

Figure 27:
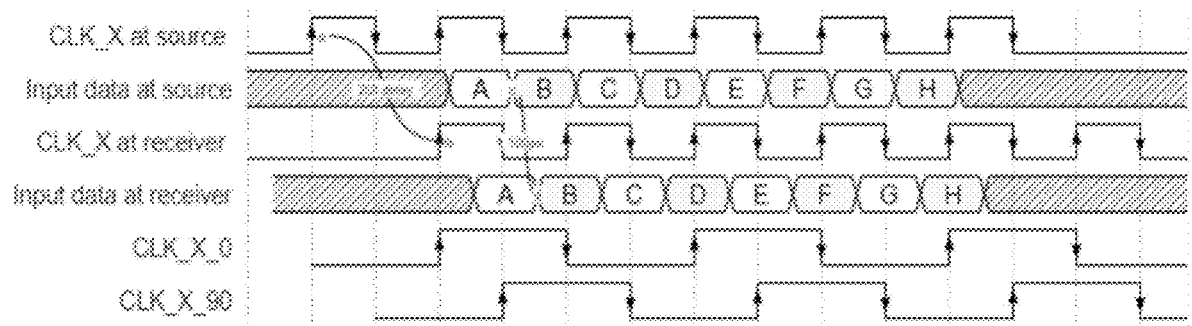
FIG. 27 illustrates a timing diagram for a data skew scenario in accordance with an embodiment of the present invention.
Figure 28:
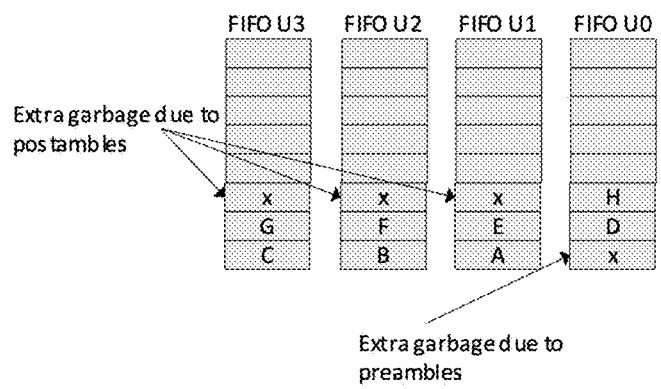
FIG. 28 illustrates a FIFO operation in accordance with FIG. 27.
Figure 29:
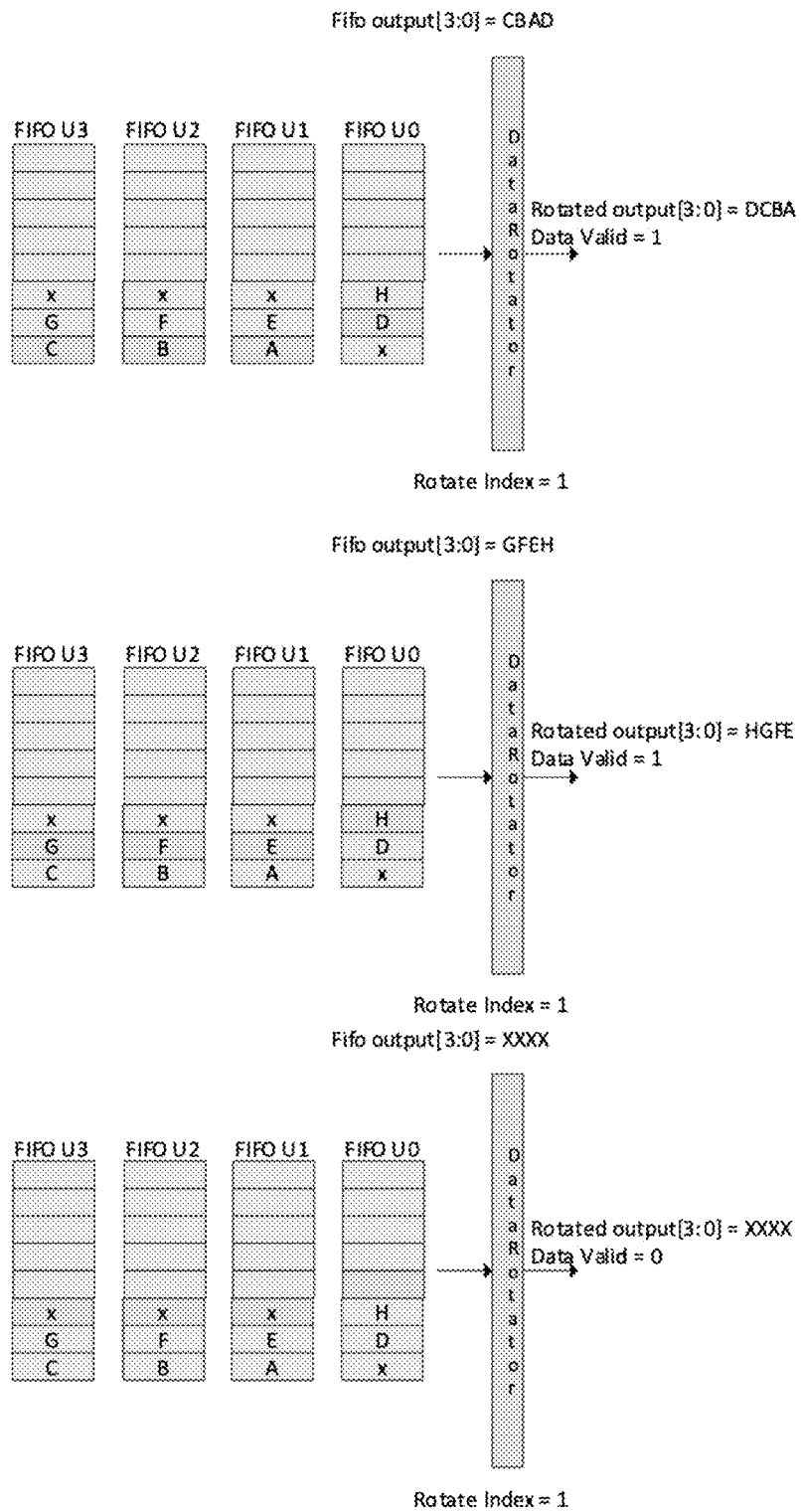
FIG. 29 illustrates a FIFO readout in accordance with FIG. 28.

In accordance with an embodiment of the present invention, the input data can be skewed by one or more cycles. The skew is introduced when the input data latency and the input clock latency are unmatched. For example, referring to FIG. 27, CLK_X at the source and the input data at the source are aligned. However, when they reach the receiver, CLK_X is delayed by more than 2 UI in comparison to the input data which is only delayed by 100 ps. Accordingly, the first valid data "A" is stored in entry 0 of FIFO U0. The next valid data "B" is stored in entry 0 of FIFO U1 as shown in FIG. 28. One garbage data is present due to preamble while the other three garbage data are present due to postambles. In order to handle this situation, the START_INDEX can be changed to 1. Hence, U0 read index is initialized to 1, U1-U3 read indices are initialized to 0. Similarly, the rotator index is also set to 1 as the START_INDEX. FIG. 29 shows that the output data for the subsequent 3 cycles when the FIFO read enable is asserted high.

Figure 30:
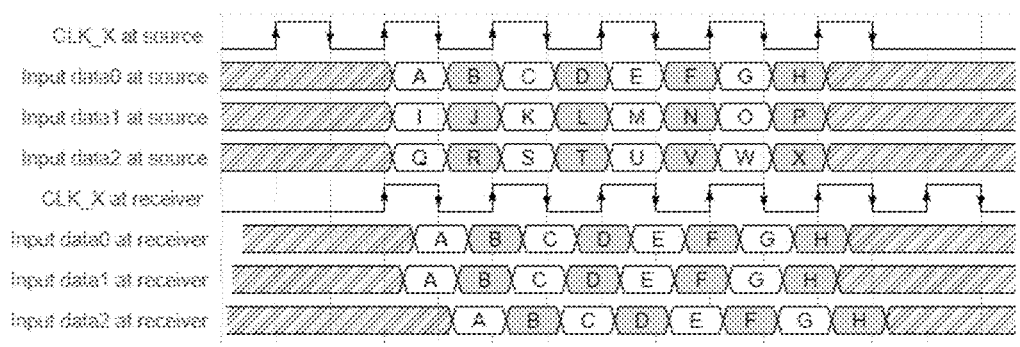
FIG. 30 illustrates a timing diagram showing multi-lane data path skew in accordance with an embodiment of the present invention.
Figure 31:
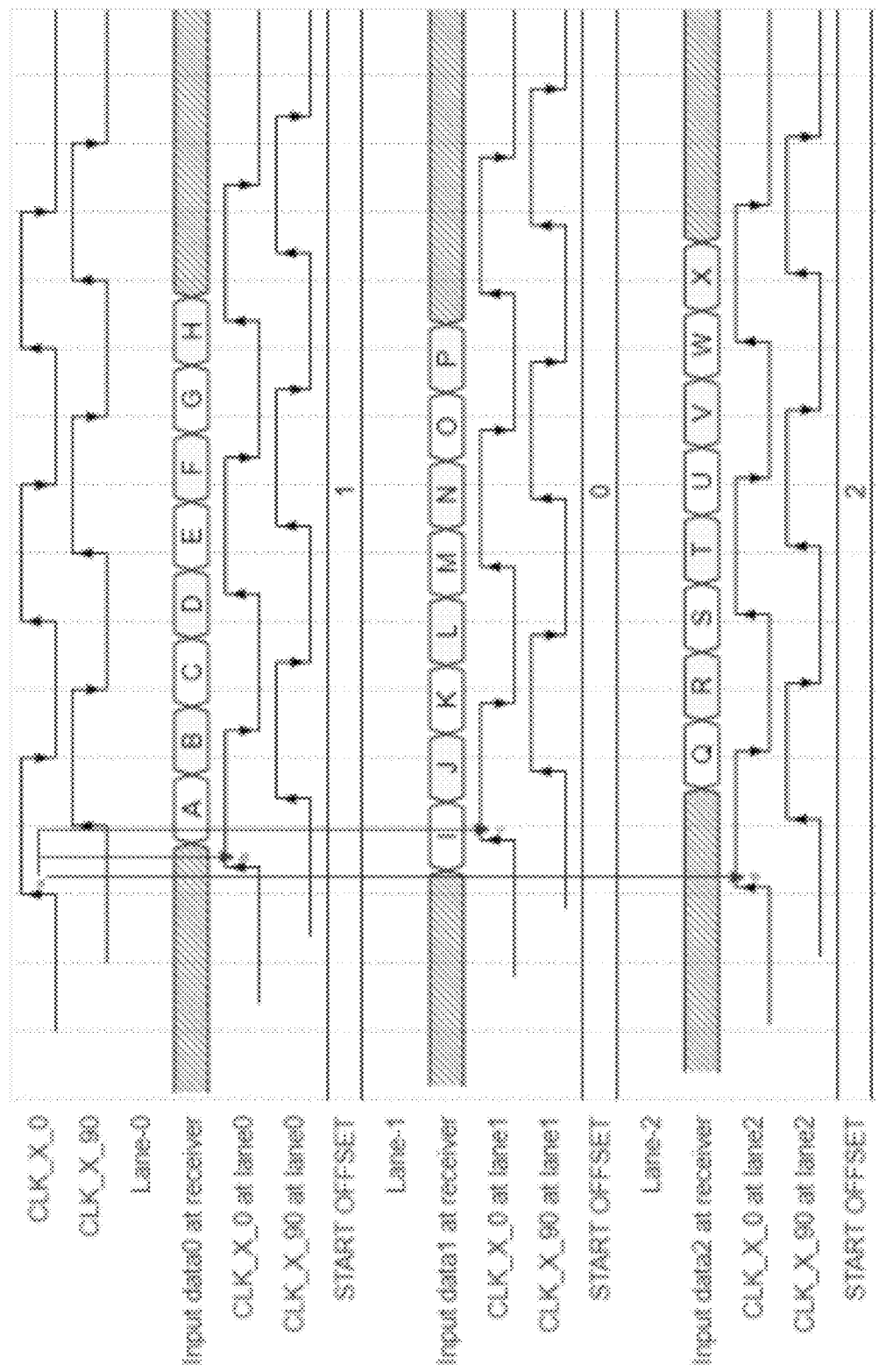
FIG. 31 illustrates a timing diagram showing adjustment for centre alignment in accordance with an embodiment of the present invention.
Figure 32:
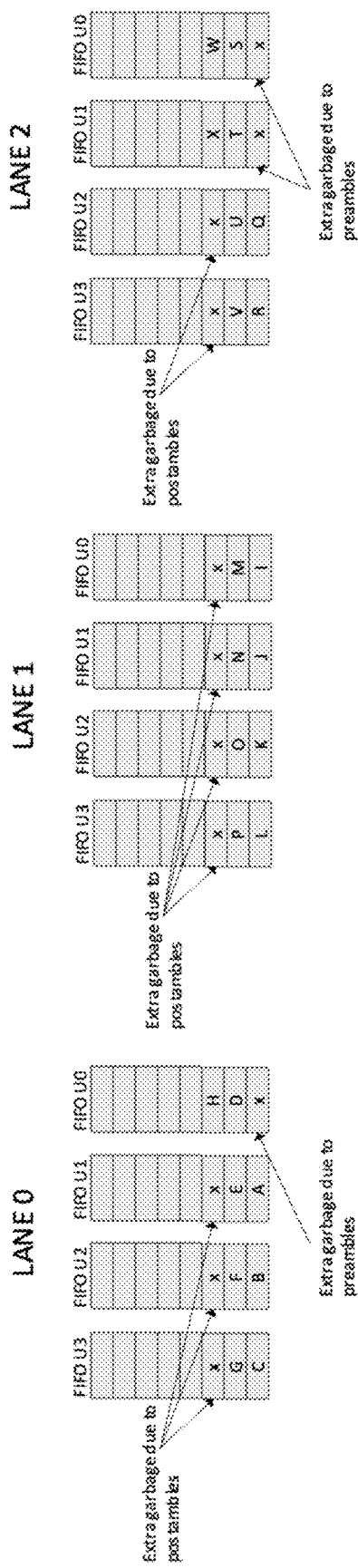
FIG. 32 illustrates a FIFO operation in accordance with FIG. 31.
Figure 33:
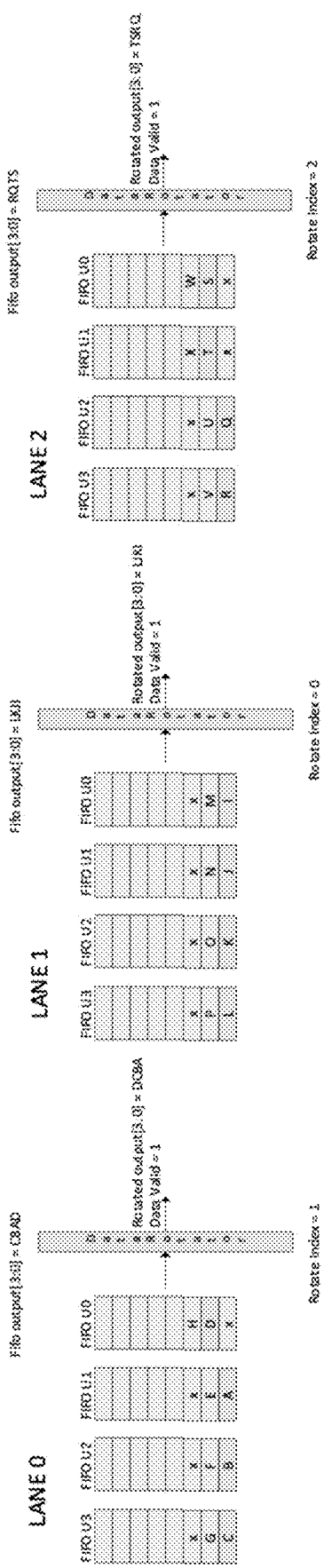
FIG. 33 illustrates a FIFO readout in accordance with FIG. 32.

In accordance with an embodiment of the present invention, there are multiple data lanes and each lane has its own clock or data skew as shown in FIG. 30. As outlined in the afore-mentioned embodiments, the lane-to-lane alignment and deskew can be achieved by adjusting the per-bit-deskew (10) on each lane and setting different START_OFFSET for each lane. Referring to FIG. 31, the rising and falling edges of CLK_X_0 and CLK_X_90 are aligned to centre to each valid data. The states of each FIFO of each lane are shown in FIG. 32. By configuring different START_OFFSET for each lane, lane alignment without extra logic or cycle penalty can be achieved. FIG. 33 shows how each lane is read out after one cycle. Therefore, it is shown that the receive data path (200) can handle any number of preambles, postambles and interambles. Further, the receive data path (200) can save area and power by utilizing latches. In addition, the receive data path (200) can handle data to clock skew and lane-to-lane skew without additional logic or pipe stages.

Receive Enable Logic (300)

Figure 34:
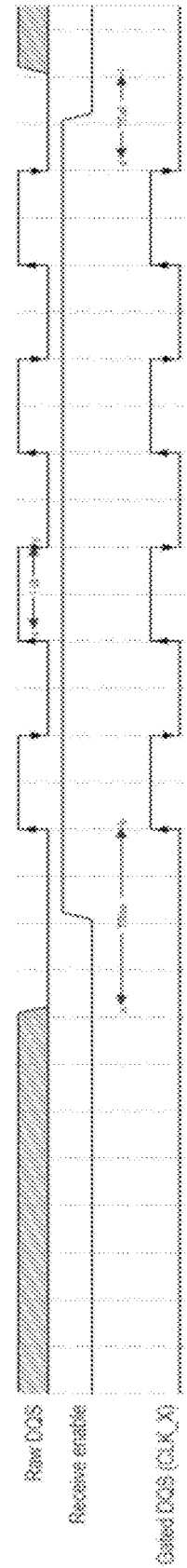
FIG. 34 illustrates a timing diagram for a receive enable logic in accordance with an embodiment of the present invention.

For protocols that utilize bidirectional strobes, including but not limited to LPDDR3, LPDDR4, LPDDR5, DDR3, DDR4 and DDR5, the input clock known as data strobe (DQS) is only valid during a specific timing window. Outside of this timing window, the strobe is unknown. Hence, the strobe cannot be used as a direct clock into the receive data path (200). The strobe has to be qualified or gated with a receive enable signal. FIG. 34 shows how the receive enable signal works. The gated strobe, known as 'gated DQS' in FIG. 34, is used as CLK_X in the receive data path (200) as outlined in the earlier embodiments. Further, the window indicated by TRise is the window available for the rising of the receive enable where the receive enable needs to be asserted. The window indicated by TFall is the window available for the falling of the receive enable where the receive enable needs to be deasserted.

Figure 35:
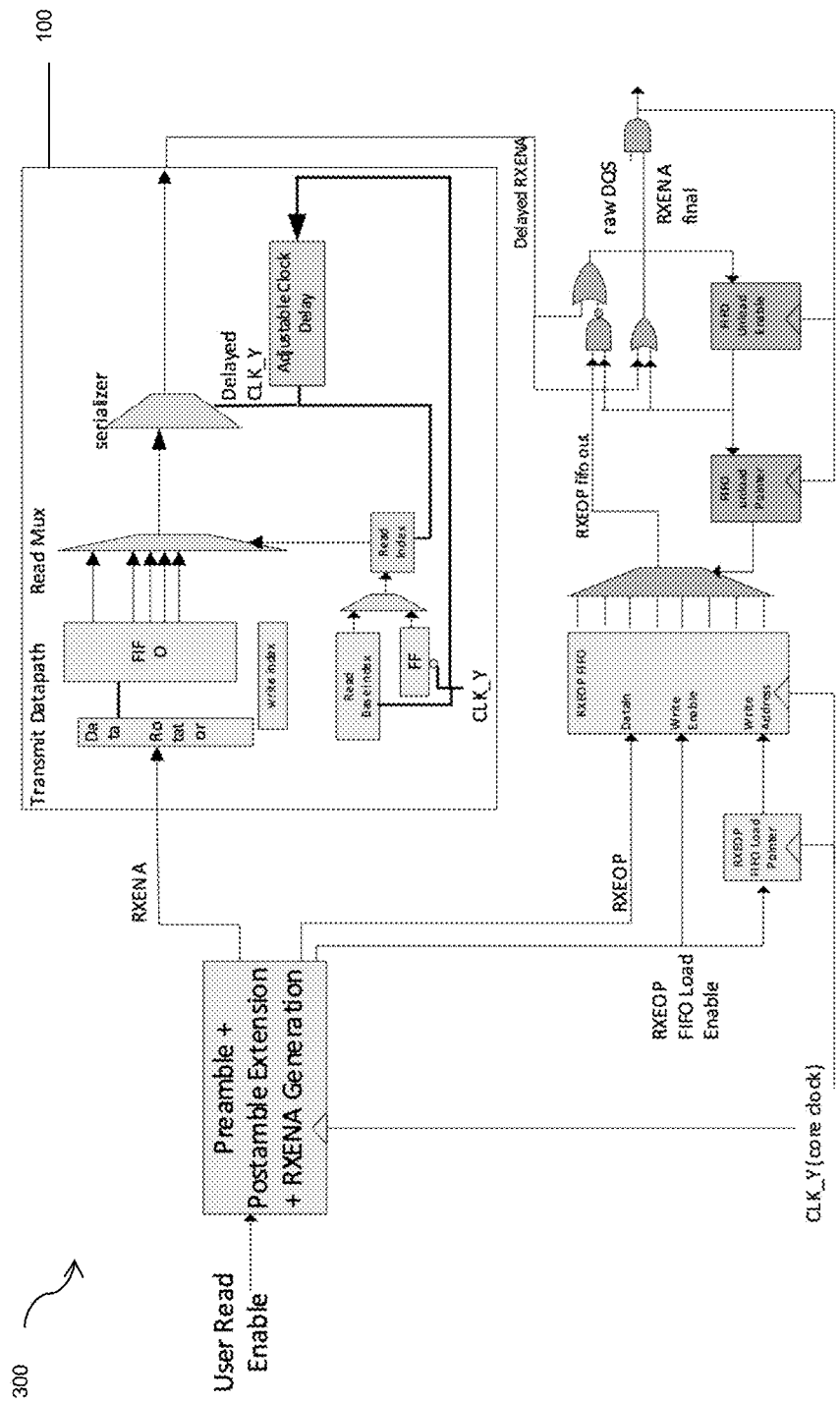
FIG. 35 is a block diagram illustrates a structure of a receive enable logic in accordance with an embodiment of the present invention.

FIG. 35 illustrates a block diagram of receive enable logic (300) in accordance with an embodiment of the present invention. Receive enable signal can be generated in such a way that the rising edge of receive enable is placed at the middle of TRise, and the falling edge of receive enable is placed at the middle of TFall. The core clock used can be CLK_Y. The frequency of CLK_Y can be the same as that of DQS. Likewise, the frequency of CLK_Y can be a half or a quarter of that of DQS. In the following embodiment, it is assumed that CLK Y is of the same frequency as DQS. Notably, two important points of the receive enable logic (300) are the generation of three major signals and the passing of receive enable (RXEOP) from CLK_Y to the DQS domain. The three major signals include but not limited to receive enable (RXENA), receive end of packet (RXEOP) and RXEOP FIFO load enable.

Figure 36:
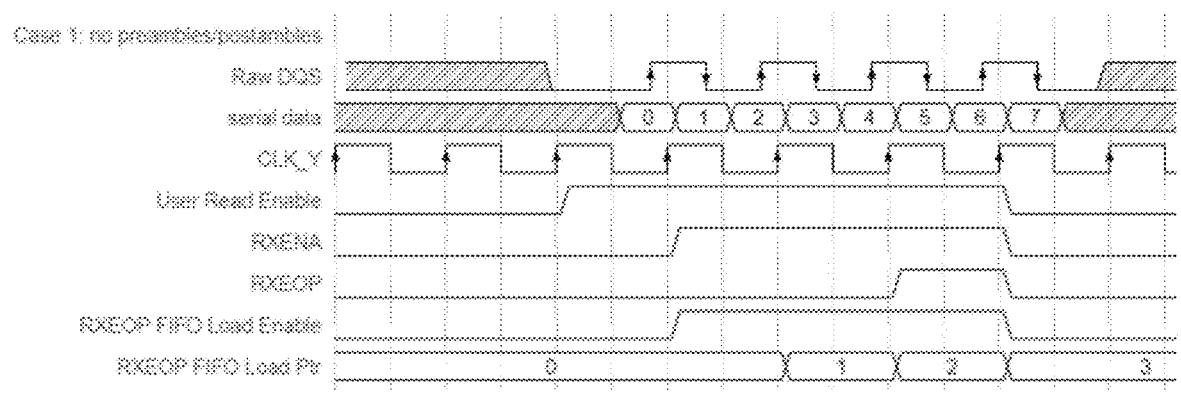
FIG. 36 illustrates a timing diagram for data transfer without strobe toggling in accordance with an embodiment of the present invention.
Figure 37:
FIG. 37 illustrates a timing diagram for data transfer with strobe toggling in accordance with an embodiment of the present invention.

First of all, the memory controller may assert the user read enable signal when it has issued a read command to the external memory device. This user read enable is an indication to the receive data path (200) that read data is expected to return from the external memory device. The user read enable is asserted for a certain number of CLK_Y cycles which is equal to the length of the data burst cycle that it intends to read. For example, if the memory controller has sent a read command for 8 chunks of data, the burst read clock cycle is 4 due to double data rate where 1 chunk of data corresponds to 0.5 clock cycle. Therefore, the user read enable is asserted for 4 clocks. However, some protocols including but not limited to DDR4, LPDDR4 and DDR5 may require extra strobe toggling such as preambles and postambles on the strobe. FIG. 36 and FIG. 37 shows 2 cases. In the first case, it is intended to perform a read burst of 4 clocks amounting to 8 data chunks and there are no any preambles or postambles. In the second case, it is intended to perform a read burst of 4 clocks with additional 2 preamble cycles and 1 postamble cycle.

Referring to FIG. 36 for the first case, RXENA is firstly copied over from user read enable with 1 cycle short. Thereafter, RXEOP is asserted at the end of RXENA. RXEOP FIFO load enable follows RXENA when CLK_Y is of same frequency as DQS. If the frequency of CLK_Y is a half of that of DQS, RXEOP FIFO load enable will be different. The RXEOP FIFO load pointer will increment on every CLK_Y cycle when RXEOP FIFO load enable is high. The value of RXEOP is written into the RXEOP FIFO at the location pointed by the RXEOP FIFO load pointer. For this case, only entry-2 of the RXEOP FIFO is written with a value of 1. Entries 0-1 are written with 0.

Referring to FIG. 37 for the second case, there are read burst of 4 clocks with additional 2 preamble cycles and 1 postamble cycle. User read enable is asserted 4 CLK_Y cycles by the memory controller. For RXENA, user read enable is extended by 3 clocks for the 2 preambles and the 1 postamble, and further cut short by 1 cycle so there is a total of 6 cycles. RXEOP is still asserted at the end of RXENA. RXEOP FIFO load enable follows RXENA as in the first case. The value of RXEOP is written into the RXEOP FIFO when RXEOP FIFO load enable is active high and at the location pointed to by the load pointer. Entries 0-4 of the RXEOP FIFO is written with 0, and only entry-5 is written with a value of 1.

Figure 38:
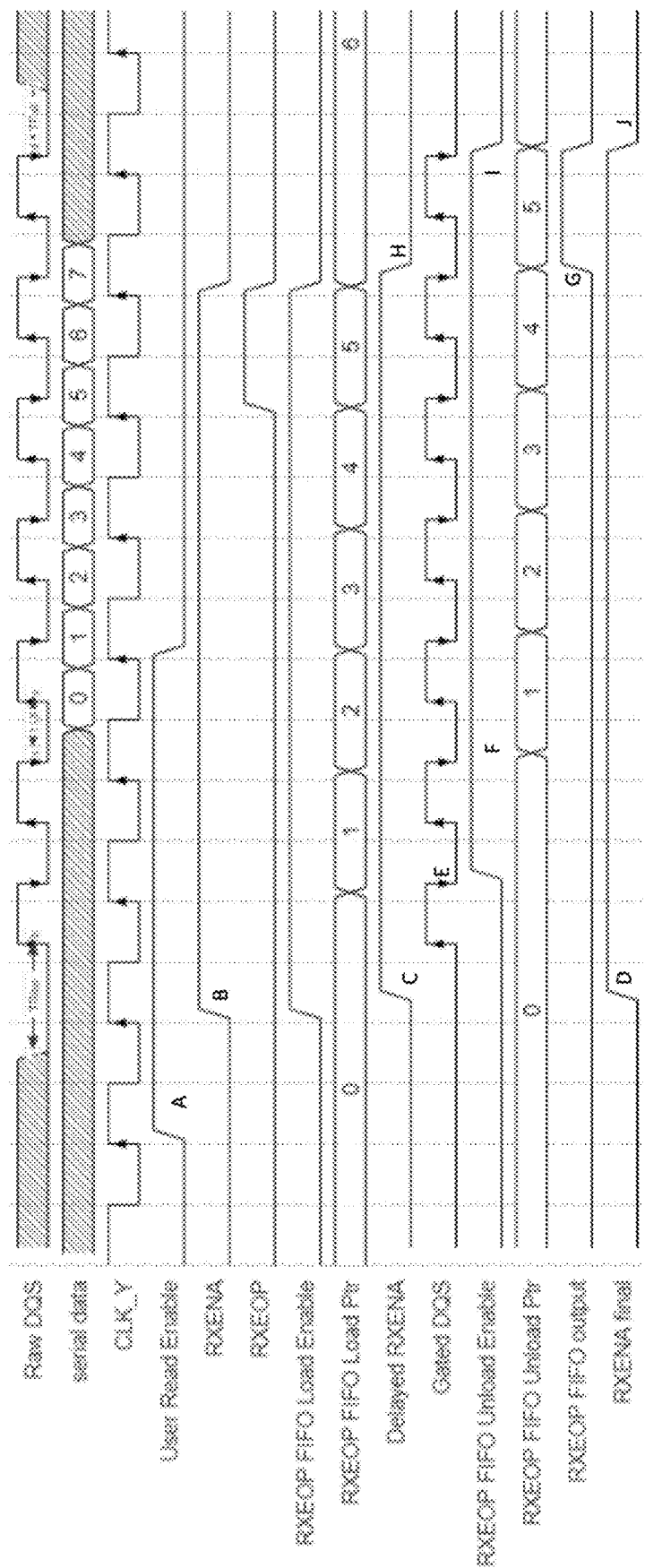
FIG. 38 illustrates an overall timing diagram for data transfer with strobe toggling of the receive enable logic illustrated in FIG. 35.

Subsequently, RXENA goes through a transmit data path (100) with no output buffer. The transmit data path (100) is utilized to delay RXENA by an arbitrary amount in order to align RXENA at the middle of the TRise window of the raw DQS. The transmit data path can be coupled with RXENA or RXEOP to ensure that a signal can be generated, which envelopes the valid DQS used for reads. The transmit data path (100) in this embodiment can serve as a slow-to-fast clock serializer with delay adjustment to transfer RXENA or RXEOP in the slow clock domain to the fast clock domain. FIG. 38 shows the timing diagram featured the events marked A-J for clearer explanation.

A. User read enable is asserted by the memory controller for 4 clock cycles.

B. RXENA is generated and extended for an additional 3 clocks, giving a total of 7 clock cycles. The extension is to cover both the preambles and postambles of DQS.

C. RXENA is delayed by the transmit data path (100) and the adjustable-delay logic in such a way that the rising edge of RXENA is placed before the first rising edge of raw DQS and within the Trise window of raw DQS.

D. RXENA Final is derived from RXENA since RXENA Final is obtained from an OR operation between RXEOP FIFO unload enable and RXENA through a logic gate circuit as shown in FIG. 35. Further, gated DQS is obtained from an AND operation between the raw DQS and RXENA Final through the logic gate circuit.

E. At the first falling edge of gated DQS, RXEOP FIFO unload enable is asserted.

F. For the next 6 clock cycles, RXEOP FIFO is unloaded.

G. When the unload pointer reaches entry-5, a value of '1' is unloaded from the RXEOP FIFO. This will cause the RXEOP FIFO unload enable to be deasserted in the next cycle.

H. Around this period, RXENA has been deasserted. However, RXENA Final is still active high due to RXEOP FIFO unload enable still being high.

I. RXEOP FIFO unload enable is deasserted.

J. RXENA Final is also deasserted because both RXENA and RXEOP FIFO unload enable are deasserted.

Figure 39:
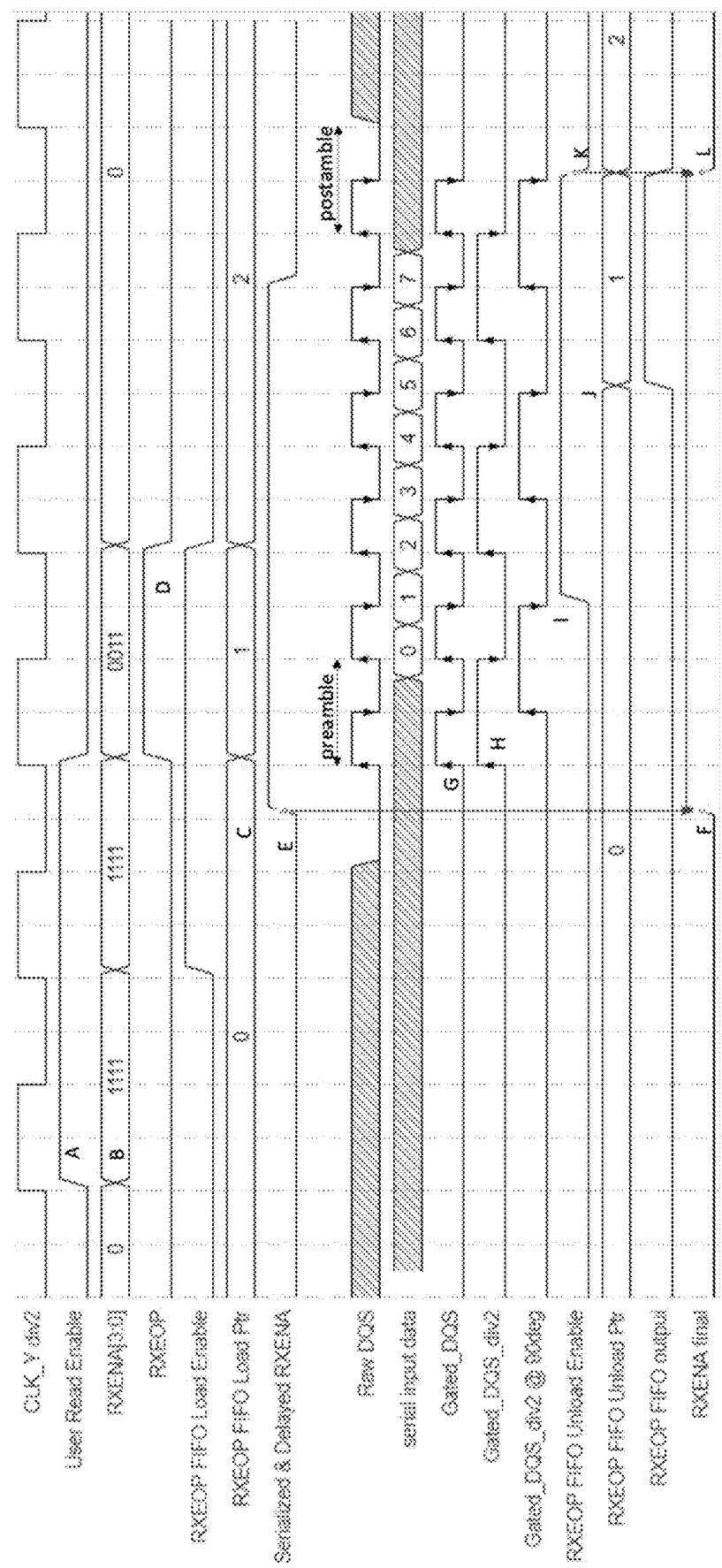
FIG. 39 illustrates an overall timing diagram for data transfer of half-rate clock of the receive enable logic illustrated in FIG. 35.

In accordance with an embodiment in the present invention, the receive enable logic (300) can be extended to half-rate CLK_Y where CLK_Y frequency is divided by 2, quarter-rate CLK_Y where CLK_Y frequency is divided by 4 or slower with minor modifications. The DQS can also be divided accordingly. Using divided clocks enables the invention to scale for DDR5 and beyond. FIG. 39 shows the operation of the invention when CLK_Y and DQS are divided by 2. In this embodiment, serial input data can be a burst-of-8 data stream, with 1 preamble and 1 postamble on the raw DQS. The events are marked as A-L for clearer explanation.

A. User read enable is asserted by the user. Since CLK_Y is divided by 2, 1 cycle of divided CLK_Y is equivalent to 2 cycles of the original/full-rate CLK_Y. Therefore, user read enable is only asserted for 2 clocks for the same amount of data.

B. RXENA is now represented by 4 bits. Each bit represents a UI interval (there are 4 UI in 1 divided CLK_Y). So when RXENA[3:0] is 4'b1111, it means RXENA is asserted for 1 full divided CLK_Y. When RXENA[3:0] is 4'b0011, then RXENA is only asserted for the first half of divided CLK_Y. Here, RXENA is held for 3 divided CLK_Y cycles, or 10 UI (there are 10 bits of '1'), to cover the preambles.

C. RXEOP FIFO load enable is asserted for 2 CLK_Y cycles which is 1 cycle less than RXENA.

D. RXEOP is asserted only on the last cycle when RXEOP FIFO load enable is asserted.

E. The 4-bits of RXENA[3:0] is serialized and delayed by the similar scheme in the transmit data path (100). The delay is adjusted in such a way that the rising edge of the serialized RXENA is placed before the first rising edge of raw DQS and within the Trise window of raw DQS.

F. RXENA Final is obtained from an OR operation between RXEOP FIFO unload enable and RXENA through the logic gate circuit.

G. Gated DQS is obtained from an AND operation between the raw DQS and RXENA Final through the logic gate circuit.

H. Divided DQS is generated by dividing the gated DQS on every rising edge of gated DQS. The divided DQS at 90 degrees is generated by dividing the gated DQS on every falling edge of gated DQS.

I. At the first falling edge of gated DQS, RXEOP FIFO unload enable is asserted.

J. For the next 2 clock cycles, RXEOP FIFO is unloaded.

K. When the unload pointer reaches entry-1, a value of '1' is unloaded from the RXEOP FIFO. This will cause the RXEOP FIFO unload enable to be deasserted in the next cycle.

L. RXEOP FIFO unload enable is deasserted. RXENA Final is also deasserted because both RXENA and RXEOP FIFO unload enable are deasserted.

Accordingly, the receive enable logic (300) can deal with any number of preambles, postambles and interambles. No additional counter is required in DQS clock domain to count the width of the receive enable signal. In the existing solutions, the additional counter has to be aware of the different memory protocols as the number of strobe toggling varies for each memory protocol. Instead, the receive enable logic (300) utilizes the variable count indication encompassing the generation of the three major signals to cater for different memory protocols. This is of critical importance because DQS runs at a high speed as the RXEOP FIFO is vital for conveying burst length including data cycles, preambles and postambles. The fall of RXENA Final is synchronous to the fall of gated DQS. Hence it is impervious to the effect of DQS drift. In addition, RXEOP FIFO can be made very small, for example, with only 3 entries. The load and unload pointers can be implemented using one hot ring counter for fast operation. Further, the receive enable logic (300) allows running CLK_Y at half-rate or half frequency for higher speed of DDR5 protocol.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A generic physical layer providing a unified architecture for interfacing with an external memory device, the generic physical layer comprising:
   a transmit data path for transmitting a parallel data to the external memory device;
   a receive data path for receiving a serial data from the external memory device; and
   a receive enable logic for masking strobe of the serial data, wherein
   the transmit data path and the receive data path each comprising a FIFO circuit, a data rotator and an adjustable-delay logic for delay tuning and a per-bit-deskew for multi-lane support.

2. The generic physical layer as claimed in claim 1, wherein the transmit data path further includes a clock-crossing multiplexor configured to select a read base index.

3. The generic physical layer as claimed in claim 1, wherein the transmit data path further includes a serializer configured to serialize the parallel data.

4. The generic physical layer as claimed in claim 1, wherein the receive data path further includes a divider configured to divide the strobe of the serial data.

5. The generic physical layer as claimed in claim 1, wherein the transmit data path further includes a multi-rank logic configured to support data transmission of multiple ranks.

6. The generic physical layer as claimed in claim 1, wherein the FIFO circuit of the receive data path is associated with a plurality of latches for handling strobe toggling, multi-lane data transfer and de-skew.

7. The generic physical layer as claimed in claim 1, wherein the receive data path further includes a counter configured to extend user read enable to cover strobe toggling.

8. The generic physical as claimed in claim 1, wherein the receive enable logic comprises a logic gate circuit.

9. A method of transmitting a parallel data to an external memory device using a generic physical layer, wherein the generic physical layer provides a unified architecture for interfacing with the external memory device, and wherein the generic physical layer includes a transmit data path for transmitting a parallel data to the external memory device, a receive data path for receiving a serial data from the external memory device, and a receive enable logic for masking strobe of the serial data, and wherein the transmit data path and the receive data path each comprising a FIFO circuit, a data rotator and an adjustable-delay logic for delay tuning and a per-bit-deskew for multi-lane support, the method comprising:

inputting the parallel data at the transmit data path;

implementing coarse delay tuning by the FIFO circuit and the data rotator, and fine delay tuning by the adjustable-delay logic;

serializing the parallel data to form serial data; and transmitting the serial data to an external pad.

10. A method of receiving a serial data from an external memory device using a generic physical layer, wherein the generic physical layer provides a unified architecture for interfacing with the external memory device, and wherein the generic physical layer includes a transmit data path for transmitting a parallel data to the external memory device, a receive data path for receiving a serial data from the external memory device, and a receive enable logic for masking strobe of the serial data, and wherein the transmit data path and the receive data path each comprising a FIFO circuit, a data rotator and an adjustable-delay logic for delay tuning and a per-bit-deskew for multi-lane support, the method comprising:

inputting the serial data at the receive data path;

dividing strobe of the serial data based on strobe edges including rising edges and falling edges by a divider; and implementing coarse delay tuning by the FIFO circuit and the data rotator, and fine delay tuning by the adjustable-delay logic.

11. The method as claimed in claim 10, wherein the method further comprising: masking the strobe of the serial data by the receive enable logic prior to inputting the serial data at the receive data path.

12. The method as claimed in claim 10, wherein the method further comprising: extending a user read enable to cover strobe toggling by a counter.

13. The method as claimed in claim 11, wherein the step of masking the strobe of the serial data comprises the step of generating three signals comprising a receive enable, a receive end of packet and a receive end of packet FIFO load enable.

* * * * *